(12) United States Patent
Mori et al.

(10) Patent No.: US 7,098,121 B2
(45) Date of Patent: Aug. 29, 2006

(54) METHOD OF FORMING A FILM OF PREDETERMINED PATTERN ON A SURFACE AS WELL AS DEVICE MANUFACTURED BY EMPLOYING THE SAME, AND METHOD OF MANUFACTURING DEVICE

(75) Inventors: Yoshiaki Mori, Suwa-gun (JP); Takuya Miyakawa, Okaya (JP); Mitsuru Sato, Chino (JP); Shintaro Asuke, Suwa-gun (JP); Kenichi Takagi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 93 days.

(21) Appl. No.: 10/367,854

(22) Filed: Feb. 19, 2003

(65) Prior Publication Data

US 2004/0082163 A1    Apr. 29, 2004

(30) Foreign Application Priority Data

Mar. 14, 2002 (JP) .............................. 2002-070393

(51) Int. Cl.
*H01L 21/22* (2006.01)
(52) U.S. Cl. ...................................... 438/551
(58) Field of Classification Search ............... 438/681, 438/551
See application file for complete search history.

(56) References Cited

U.S. PATENT DOCUMENTS

| | | | |
|---|---|---|---|
| 6,399,257 B1 * | 6/2002 | Shirota et al. .................. 430/7 |
| 6,610,552 B1 * | 8/2003 | Fujimori et al. ............... 438/22 |
| 6,677,243 B1 * | 1/2004 | Okada et al. ................. 438/706 |
| 6,734,029 B1 * | 5/2004 | Furusawa .................... 438/22 |
| 2003/0099774 A1 * | 5/2003 | Morii et al. .................. 427/335 |
| 2003/0118947 A1 * | 6/2003 | Grant ......................... 430/311 |

FOREIGN PATENT DOCUMENTS

| | | |
|---|---|---|
| JP | A-8-179110 | 7/1996 |
| JP | A-8-179113 | 7/1996 |
| JP | A-9-33711 | 2/1997 |
| JP | A-10-123315 | 5/1998 |
| JP | A-10-123500 | 5/1998 |
| JP | A-10-142417 | 5/1998 |
| JP | A-10-142418 | 5/1998 |
| JP | A-10-197715 | 7/1998 |

(Continued)

OTHER PUBLICATIONS

Merriam-Webster's Colegiate Dictionary, 10th edition, 2001, pp. 994.*

Primary Examiner—W. David Coleman
(74) Attorney, Agent, or Firm—Oliff & Berridge, PLC

(57) ABSTRACT

An object is to provide a mask formation method, which can curtail a manufacturing cost.

A method of forming a film of predetermined pattern on the front surface of a member to-be-processed is so constructed as to carry out the step (S178) of improving the adherence of a pattern material solution to the member to-be-processed, the step (S180) of filling up a pattern forming recess provided in a mask on the surface of the member to-be-processed with a pattern material solution, the step (S186) of improving the film quality of the pattern film to-be-formed by processing the pattern material solution, the step (S188) of removing the pattern material solution having adhered on the mask, the step (S190) of drying the pattern material solution, and the step (S196) of subjecting the pattern film to annealing processing.

32 Claims, 16 Drawing Sheets

FOREIGN PATENT DOCUMENTS

| | | |
|---|---|---|
| JP | A-10-197716 | 7/1998 |
| JP | A-10-326559 | 12/1998 |
| JP | 11-271753 A | 10/1999 |
| KR | 2001-0003324 | 1/2001 |

* cited by examiner

FIG. 6
(1)
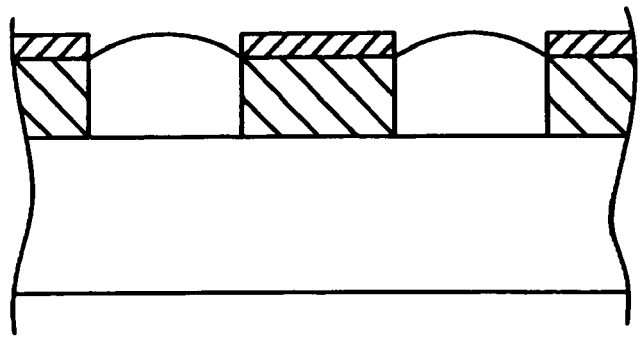
(2)
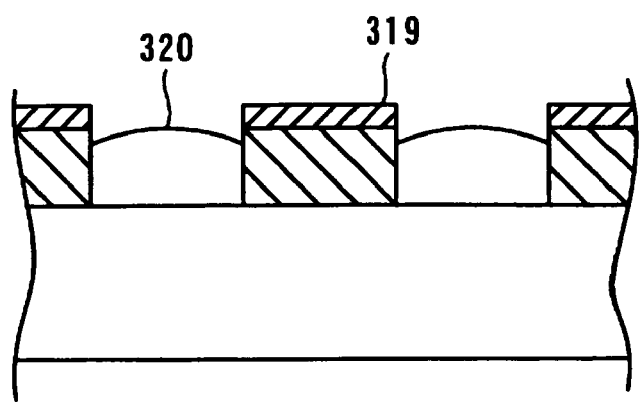
(3)
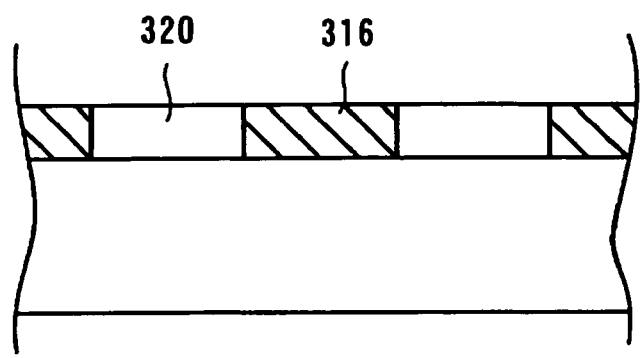
(4)
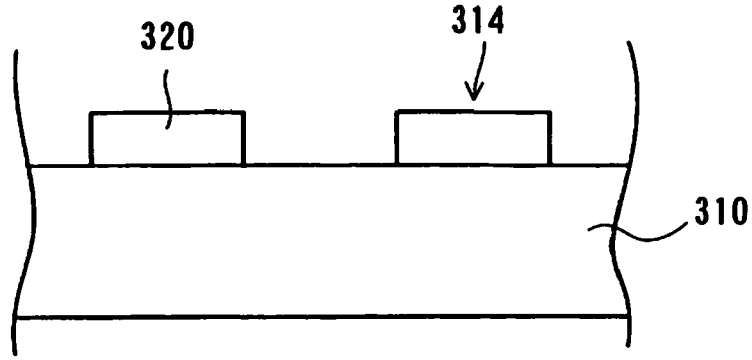

FIG. 7
(1)
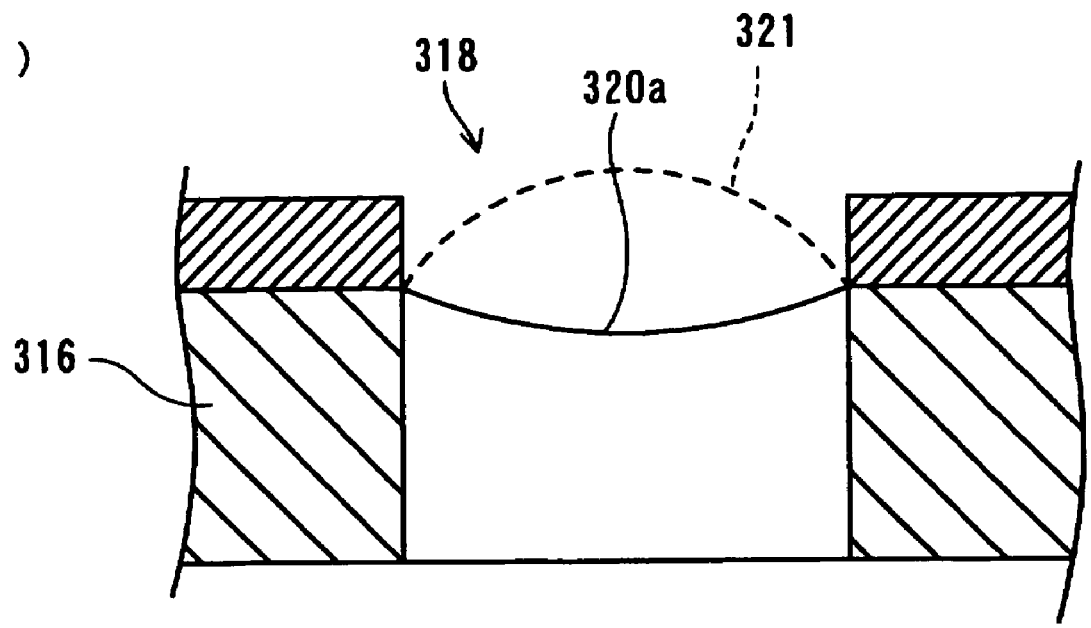
(2)
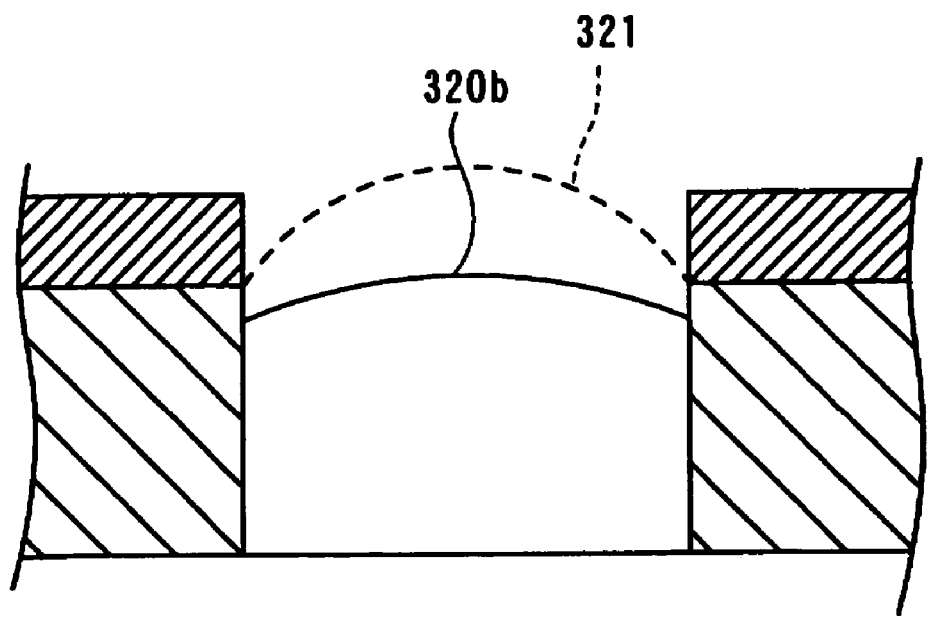

FIG. 9
(1)
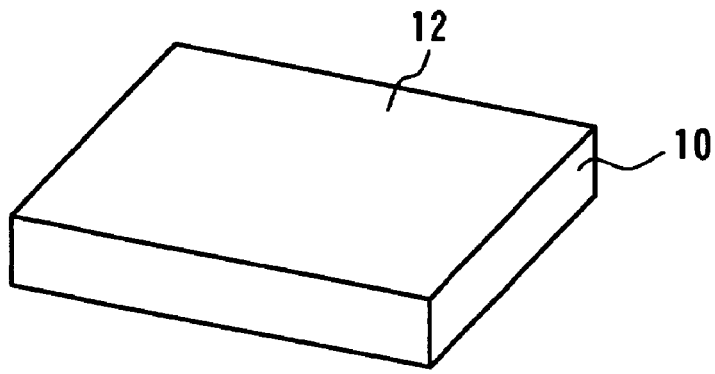
(2)
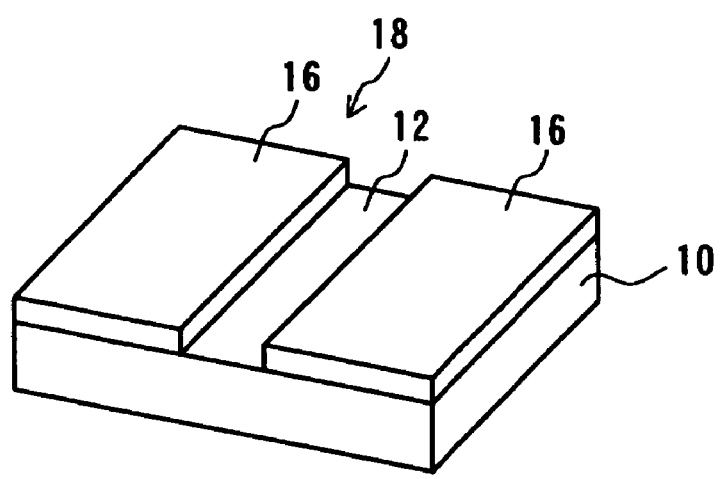
(3)
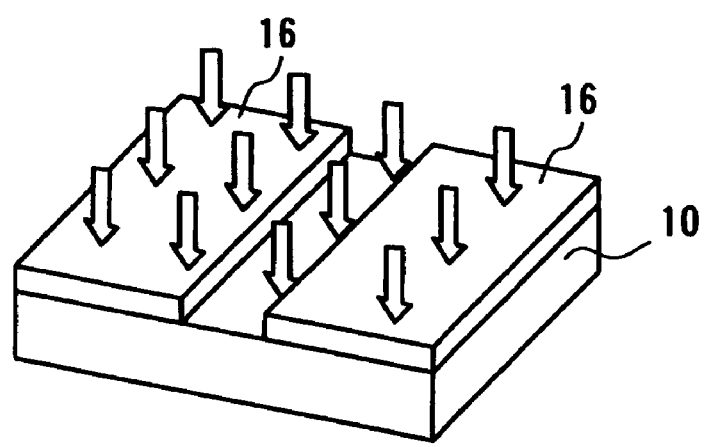

FIG. 10
(1)
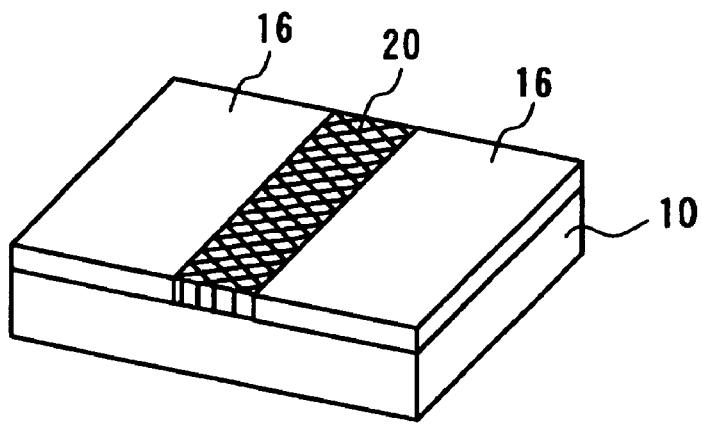
(2)
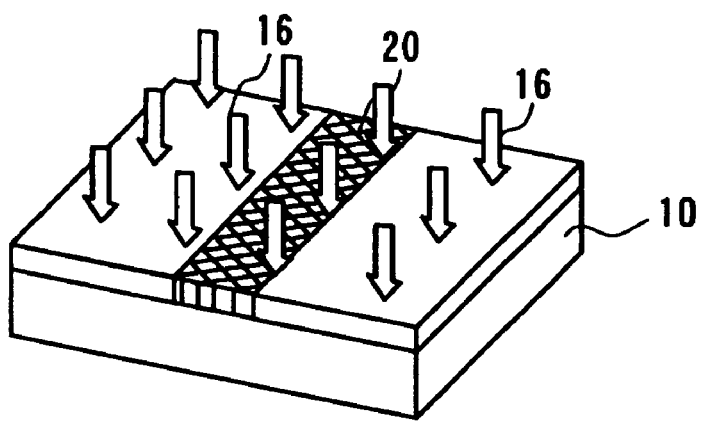
(3)
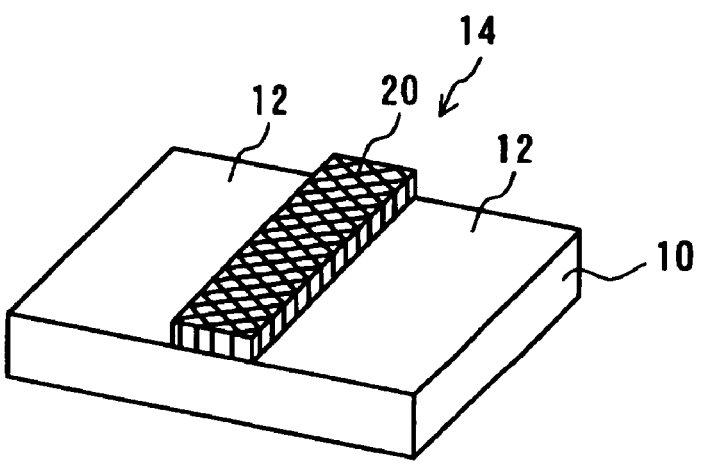

FIG. 12
(1)
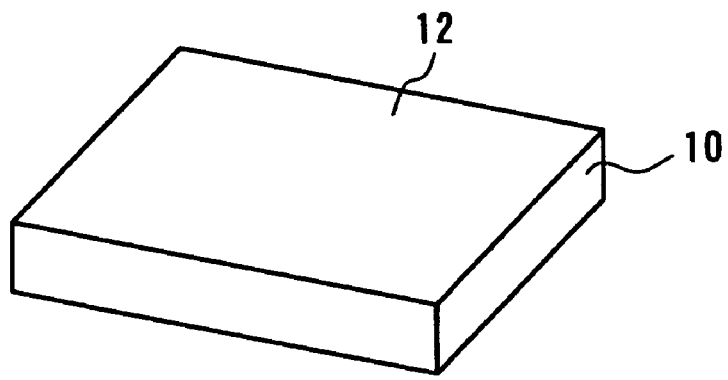
(2)
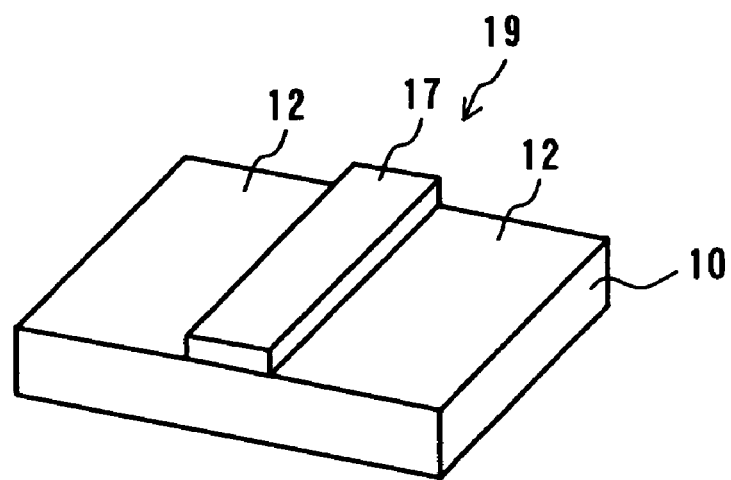
(3)
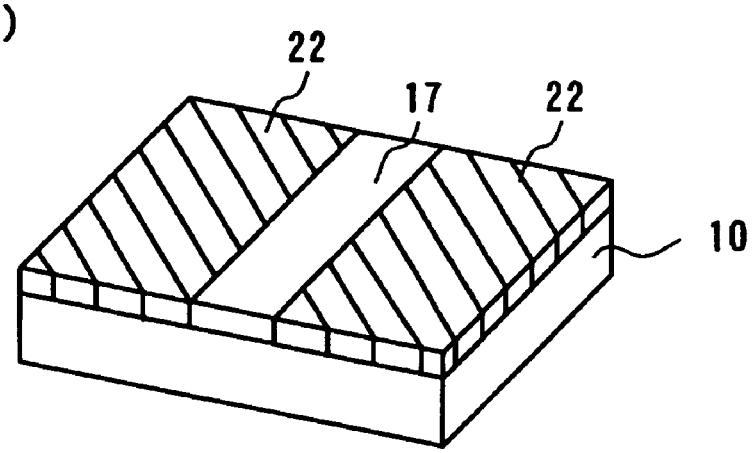

FIG. 13
(1)
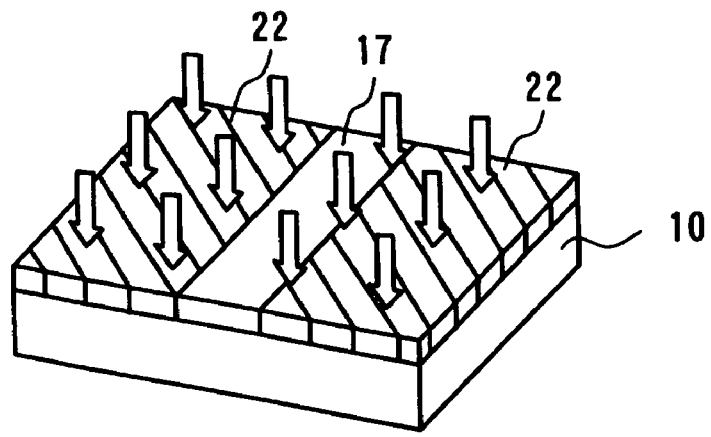
(2)
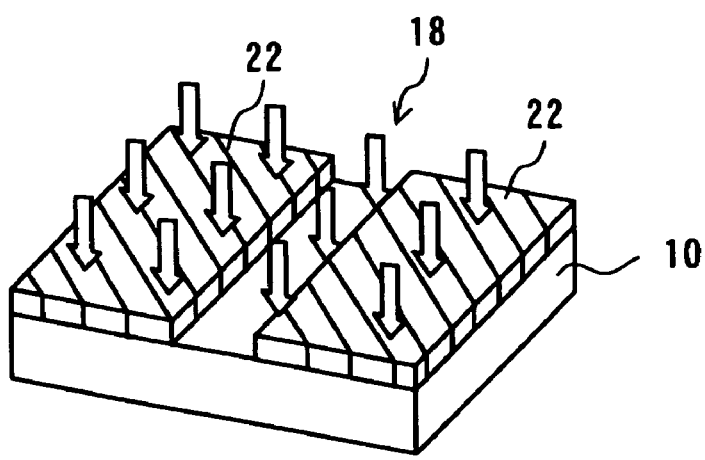
(3)
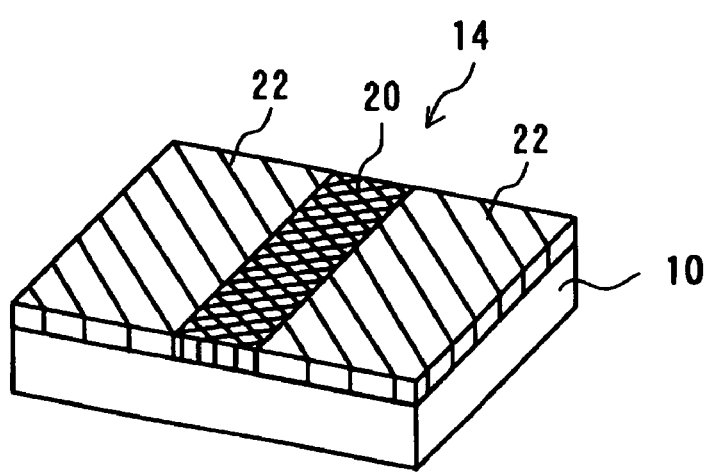

FIG. 14
PRIOR ART
(1)
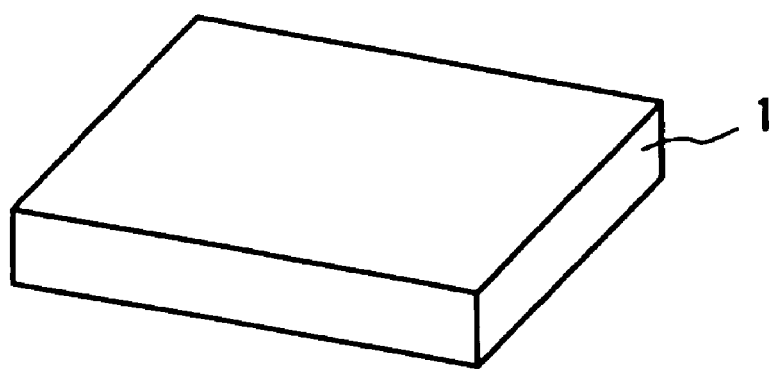
(2)
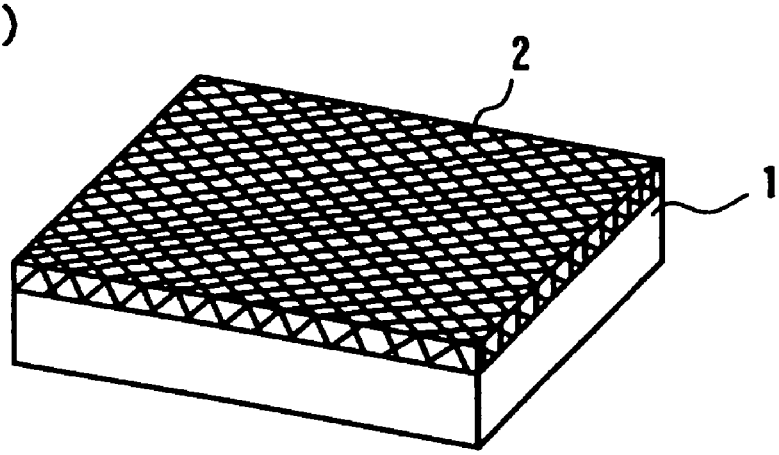
(3)
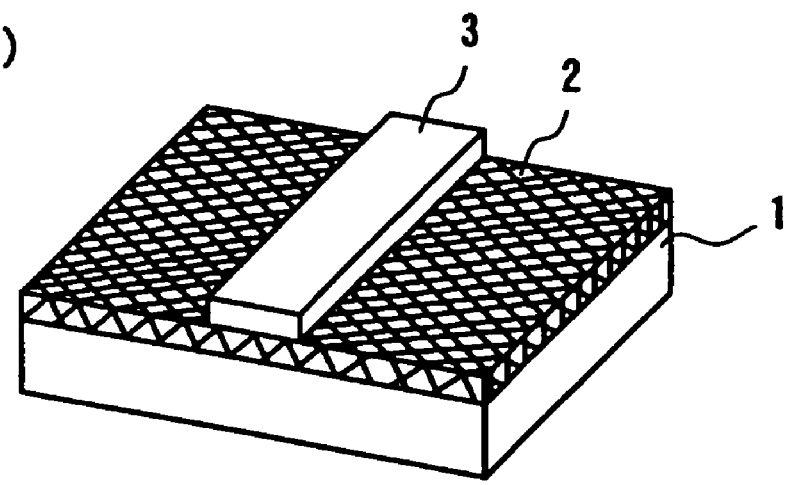

FIG. 15
PRIOR ART
(1)
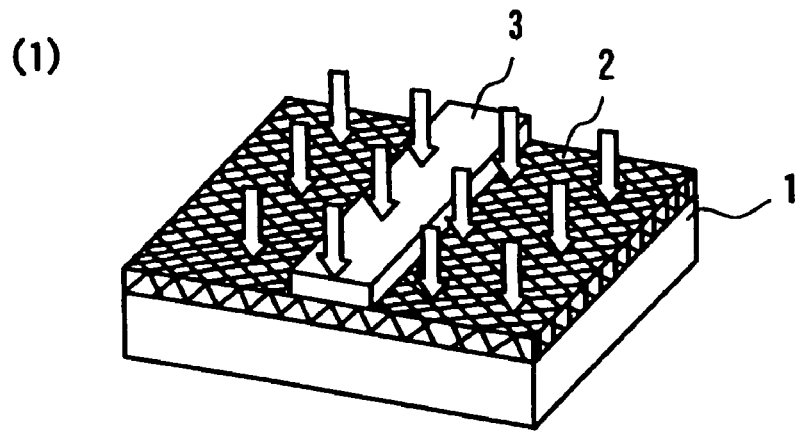
(2)
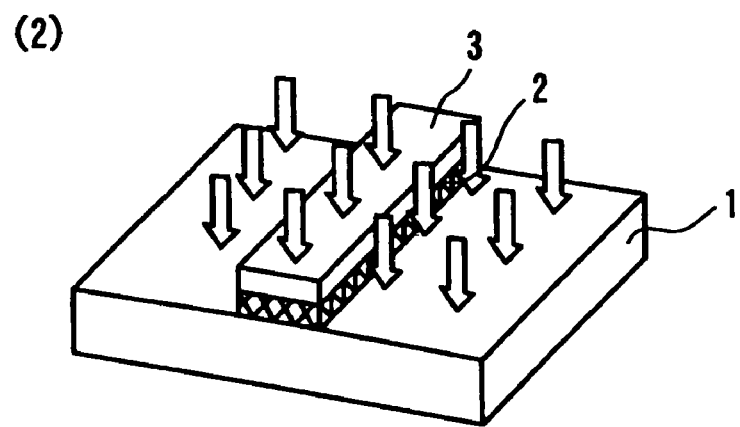
(3)
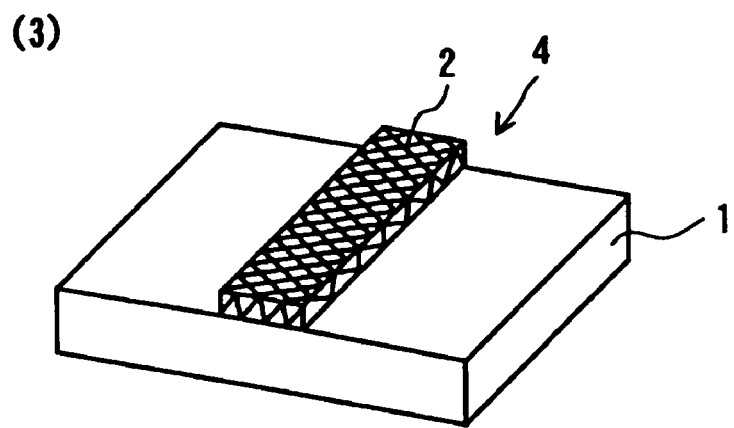

METHOD OF FORMING A FILM OF PREDETERMINED PATTERN ON A SURFACE AS WELL AS DEVICE MANUFACTURED BY EMPLOYING THE SAME, AND METHOD OF MANUFACTURING DEVICE

BACKGROUND OF THE INVENTION

1. Field of Invention

The present invention relates to a film formation method as well as a device manufactured by employing the method, and a method of manufacturing a device. More particularly, the invention relates to a film formation method of forming a pattern film in the vicinity of an atmospheric pressure without requiring a lowered-pressure environment, in manufacturing devices, and the devices manufactured by the method.

2. Description of Related Art

In the related art, in manufacturing a semiconductor device, after forming elements on the front surface of a wafer substrate, a wiring pattern is formed on the upper layer side of the elements.

FIG. 14(1)–FIG. 15(3) are schematics showing a related art patterning process. In order to form, for example, a wiring line on the front surface of a semiconductor wafer 1 as shown in FIG. 14(1), the surface of the semiconductor wafer 1, formed with an insulating film (not shown), is subjected to plasma CVD so as to form a wiring layer 2 on the upper layer of the insulating film, as shown in FIG. 14(2). Incidentally, the wiring layer 2 may well be formed by sputtering.

After the wiring layer 2 has been formed on the semiconductor wafer 1 in this manner, a resist film is formed over the wiring layer 2 by coating with a photoresist, and it is brought into a light exposure step and a photo-etching step, thereby to form a patterned resist film 3 as shown in FIG. 14(3).

Subsequently, as shown in FIG. 15(1), the semiconductor wafer 1 is brought into a dry etching step, at which the wiring layer 2 is etched using the resist film 3 as a mask. The resultant state is shown in FIG. 15(2). After the wiring layer 2 has been left only under the resist film 3 in this way, the resist film 3, overlying the wiring layer 2, is removed by a solvent.

Via such steps, a wiring pattern 4 can be formed on the surface of the semiconductor wafer 1 as shown in FIG. 15(3).

However, problems as indicated below have been involved in the manufacturing process stated above and a semiconductor device manufactured by the process.

Since most of the related art steps are carried out in vacuum states (lowered-pressure environments), vacuum processing facilities are indispensable to these manufacturing steps. Regarding the vacuum processing facilities, there has been the problem that, in performing the processing steps, energy consumption which includes energy relating to infrastructure equipment for the evacuation to surroundings, the circulation of cooling water, etc. becomes enormous to occupy more than 60% of energy which is necessary for the manufacturing process.

Herein, increase in the energy consumption is considered to be ascribable to the following constituents of the vacuum processing facilities: Chamber load lock to transfer workpieces from an environment under an atmospheric pressure into a vacuum state, and a plurality of dry pumps or turbo-pumps to bring a processing chamber into vacuum.

Also included are the enlargements of footprints attributed to the pluralization of chambers to enhance a throughput, and the attendant enlargement of the area of a clean room, increase in the number of infrastructure equipment for keeping them, and so forth.

Moreover, with the plasma CVD, large quantities of PFC gases are used to provide chamber cleaning and are emitted to heavily burden the global environment with global warming, the destruction of the ozone layer, etc.

SUMMARY OF THE INVENTION

In view of the above and/or other problems, the present invention provides a film formation method, which is capable of reducing or curtailing a manufacturing cost and reducing the amount of use of PFC gases.

In addition, the present invention provides a film formation method, which is capable of obtaining a pattern film having a desired film quality. Also, the invention provides a film formation method, which is capable of obtaining a pattern film of desired shape. Also, the invention provides a film formation method, which is capable of preventing any impurity from mixing into a pattern film.

The present invention also provides devices manufactured using the above described film formation methods, and a method of manufacturing a device.

In order to accomplish the above, in a method where a film of predetermined pattern is formed on a front surface of a member to-be-processed, a film formation method is so constructed that, after the member to-be-processed has been washed, the step of filling up a pattern forming recess, provided in a mask at the surface of the member to-be-processed, with a pattern material solution is performed.

The related art step of removing a pattern material formed on the surface of the member to-be-processed, is changed into the step of sticking/embedding the pattern material into the recess, so that all the above steps can be performed in an environment under the atmospheric pressure or under a pressure near the atmospheric pressure. Therefore, vacuum facilities need not be disposed, and it is possible to save energy for operating the facilities. Accordingly, a manufacturing cost can be reduced or curtailed.

Incidentally, usable as the pattern material solution is a dispersion in which the ultra-fine particles of a pattern material are dispersed in a solvent, a solution in which the compound of a pattern material is dissolved in a solvent, or the like. Usable as the solvent may be an inorganic solvent, such as water or hydrogen peroxide.

It is also possible to use any of organic solvents, such as alcohols, organic esters, alka-compounds, ethers, alicyclic compounds, aromatic compounds, ketones, carbonic acid, and amines. Solvents can be used after a property such as the boiling point, wettability or viscosity thereof or the solubility or insolubility of the solute has been adjusted as may be needed. On the other hand, a surfactant, such as of anions, nonions or cations, a coupling agent, such as of silane type, aluminate type or titanate type, or the like, can be used as an additive agent for the pattern material solution.

In a case where the film formation step is performed by a wet system, such as coating or impregnation, it is possible to use a method, such as LSMCD (Liquid Source Misted Chemical Deposition), or spin, spray, dip or direct coating (CAP Coat). In a case where the film formation step is performed by a dry system, such as evaporation or CVD, it is possible to employ a method, such as MOCVD, normal-pressure CVD, P-CVD, photo-CVD or thermal CVD or the like.

In the film formation based on the LSMCD method, a film formation rate can be controlled by adjusting the energy of an electron beam, which irradiates the misted pattern material solution, the intensity of a bias electric field, which is applied to the interior of a film-formation processing chamber, or the like. In case of the wet-system film formation, the film formation rate can be controlled by adding an additive agent (solvent of high permittivity: for example, n-octane) into the pattern material solution.

In a method where a film of predetermined pattern is formed on a front surface of a member to-be-processed, a film formation method according to the present invention is so constructed as to perform the step of filling up a pattern forming recess provided in a mask at the surface of the member to-be-processed with a pattern material solution, and the step of drying the pattern material solution.

In a method where a film of predetermined pattern is formed on a front surface of a member to-be-processed, a film formation method according to the present invention is so constructed as to perform the step of filling up a pattern forming recess provided in a mask at the surface of the member to-be-processed with a pattern material solution, and the step of subjecting the pattern film to annealing processing.

The film formation proceeds in a state where the contact area between the pattern material solution and an atmosphere is large, so that the solvent is easy of vaporization. Accordingly, it is permitted to shorten a drying time period, and a manufacturing cost can be reduced or curtailed.

The drying step and the annealing processing step can be performed by heating the member to-be-processed with a heater, a lamp or the like. The drying step is performed at a temperature below the boiling point of the solvent.

In a method where a film of predetermined pattern is formed on a front surface of a member to-be-processed, a film formation method according to the present invention is so constructed as to perform the step of filling up a pattern forming recess provided in a mask at the surface of the member to-be-processed with a pattern material solution, and the step of enhancing a film quality of the pattern film to-be-formed by processing the pattern material solution. By processing the pattern material solution, it is possible to reliably enhance the film quality, and the pattern film having a desired film quality can be obtained.

The film-quality improvement step can be performed by controlling the atmosphere, or by adding an additive agent into the pattern material solution in the case of the wet-system film formation. Usable as the additive agent of the wet-system film formation is an oxidant, such as hydrogen peroxide, nitric acid or perchloric acid solution, a reductant, such as formic acid, oxalic acid or hydrogen iodide, or the like. Besides, introducible as the atmosphere is a gas which contains the radicals of F, O, H or the like activated by a plasma, an electron gun, photoexcitation or the like, an inert gas such as $N_2$ or Ar, or the like. The introduced gas may well be irradiated with ultraviolet radiation, a laser beam, an electron beam or the like. Herein, if necessary, the atmosphere can have its pressure raised in order to prevent voids or lowered to, for example, 1 Torr or less.

In a method where a film of predetermined pattern is formed on a front surface of a member to-be-processed, a film formation method according to the present invention is so constructed as to perform the step of enhancing adherence of a pattern material solution to the member to-be-processed, and the step of filling up a pattern forming recess provided in a mask at the surface of the member to-be-processed with the pattern material solution. Since, in this way, the adherence enhancement processing can be performed immediately before or simultaneously with the filling-up of the recess with the pattern material solution, it is possible to ensure a good adherence, and the pattern film of desired shape can be obtained.

In the case of the wet system, the adherence enhancement step can be performed by processing with pure water, oxidation processing with ozone water or the like, processing with an acid, processing with an alkali, processing with a surfactant, such as of anions, nonions or cations, processing with a coupling agent such as of silane type, aluminate type or titanate type, the formation of a SAM film, processing with an organic solvent, or the like. In the case of the dry system, the adherence enhancement step can be performed by ultraviolet processing, oxidation processing with an ozone gas or the like activated by a plasma, an electron gun, photoexcitation or the like, electron-beam irradiation, the evaporation of a coupling agent of silane type or the like, the plasma polymerization of polyethylene or the like, and so forth. Incidentally, it can also be performed by directly irradiating the member to-be-processed with ultraviolet radiation, an electron beam or the like.

In a method where a film of predetermined pattern is formed on a front surface of a member to-be-processed, a film formation method according to the present invention is so constructed as to perform the step of filling up a pattern forming recess provided in a mask at the surface of the member to-be-processed with a pattern material solution, and the step of removing the pattern material solution having adhered on the mask. Thus, the pattern material solution can be easily removed before drying, so that a manufacturing cost can be reduced or curtailed.

The step of removing the droplets of the pattern material solution can be performed by employing spinning, wiping, an inclination system, ultrasonic waves, or the like.

In a method where a film of predetermined pattern is formed on a front surface of a member to-be-processed, a film formation method according to the present invention is so constructed as to perform the step of filling up a pattern forming recess provided in a mask at the surface of the member to-be-processed with a pattern material solution, the step of drying the pattern material solution, and the step of subjecting the pattern film to annealing processing.

Besides, in a method where a film of predetermined pattern is formed on a surface of a member to-be-processed, a film formation method according to the present invention is so constructed as to perform the step of filling up a pattern forming recess provided in a mask at the surface of the member to-be-processed with a pattern material solution, the step of enhancing a film quality of the pattern film to-be-formed by processing the pattern material solution, and the step of drying the pattern material solution. In this case, the enhancement of the film quality is promoted at a high temperature, so that the pattern film of desired film quality can be obtained.

In a method where a film of predetermined pattern is formed on a front surface of a member to-be-processed, a film formation method according to the present invention is so constructed as to perform the step of enhancing adherence of a pattern material solution to the member to-be-processed, the step of filling up a pattern forming recess provided in a mask at the surface of the member to-be-processed with the pattern material solution, and the step of drying the pattern material solution.

In a method where a film of predetermined pattern is formed on a front surface of a member to-be-processed, a film formation method according to the present invention is so constructed as to perform the step of filling up a pattern forming recess provided in a mask at the surface of the member to-be-processed, with a pattern material solution, the step of removing the pattern material solution having adhered on the mask, and the step of drying the pattern material solution.

In a method where a film of predetermined pattern is formed on a front surface of a member to-be-processed, a film formation method according to the present invention is so constructed as to perform the step of filling up a pattern forming recess provided in a mask at the surface of the member to-be-processed with a pattern material solution, the step of enhancing a film quality of the pattern film to-be-form by processing the pattern material solution, and the step of subjecting said pattern film to annealing processing. In this case, the enhancement of the film quality is promoted at a high temperature, so that the pattern film of desired film quality can be obtained.

In a method where a film of predetermined pattern is formed on a front surface of a member to-be-processed, a film formation method according to the present invention is so constructed as to perform the step of enhancing adherence of a pattern material solution to the member to-be-processed, the step of filling up a pattern forming recess provided in a mask at the surface of said member to-be-processed with the pattern material solution, and the step of subjecting the pattern film to annealing processing.

In a method where a film of predetermined pattern is formed on a front surface of a member to-be-processed, a film formation method according to the present invention is so constructed as to perform the step of filling up a pattern forming recess provided in a mask at the surface of the member to-be-processed with a pattern material solution, the step of removing the pattern material solution having adhered on the mask, and the step of subjecting the pattern film to annealing processing.

In a method where a film of predetermined pattern is formed on a front surface of a member to-be-processed, a film formation method according to the present invention is so constructed as to perform the step of enhancing adherence of a pattern material solution to the member to-be-processed, the step of filling up a pattern forming recess provided in a mask at the surface of said member to-be-processed with the pattern material solution, and the step of enhancing a film quality of the pattern film to-be-formed by processing said pattern material solution.

In a method where a film of predetermined pattern is formed on a front surface of a member to-be-processed, a film formation method according to the present invention is so constructed as to perform the step of filling up a pattern forming recess provided in a mask at the surface of said member to-be-processed with a pattern material solution, the step of enhancing a film quality of the pattern film to-be-formed by processing the pattern material solution, and the step of removing said pattern material solution having adhered on the mask.

In a method where a film of predetermined pattern is formed on a front surface of a member to-be-processed, a film formation method according to the present invention is so constructed as to perform the step of enhancing adherence of a pattern material solution to the member to-be-processed, the step of filling up a pattern forming recess provided in a mask at the surface of said member to-be-processed with the pattern material solution, and the step of removing said pattern material solution having adhered on the mask.

In a method where a film of predetermined pattern is formed on a front surface of a member to-be-processed, a film formation method according to the present invention is so constructed as to perform the step of enhancing adherence of a pattern material solution to the member to-be-processed, the step of filling up a pattern forming recess provided in a mask at the surface of said member to-be-processed with the pattern material solution, the step of enhancing a film quality of the pattern film to-be-formed by processing said pattern material solution, the step of removing said pattern material solution having adhered on the mask, the step of drying said pattern material solution, and the step of subjecting said pattern film to annealing processing.

With any of the above constructions, it is possible to perform the each step in an identical processing chamber, and a manufacturing cost can be curtailed. Moreover, since the each step can be carried out without exposing the member to-be-processed to the atmospheric air, the pattern film having a desired film quality can be obtained.

It is also allowed to employ a construction, in which the step of drying the pattern material solution is performed after the above film formation method has been carried out. In this case, the front surface of the pattern film can be formed into a desired shape by independently setting the conditions of the drying step.

It is also allowed to employ a construction, in which the step of subjecting the pattern film to annealing processing is performed after the above film formation method has been carried out.

In this case, the pattern film having a desired film quality can be obtained by independently setting an atmosphere, which is especially suited to the annealing processing step.

Incidentally, the drying step can be performed by lowered-pressure drying in an activated gas atmosphere generated by a plasma, an electron gun, photoexcitation or the like, or in an inert gas atmosphere, microwave heating, high-frequency heating, lamp heating using a temperature raising step method or the like, heater heating using the temperature raising step method or the like, and so forth. Incidentally, the annealing processing step can also be performed by the above method.

It is also allowed to employ a construction, in which the step of removing the pattern material solution having adhered on the mask is performed after the above film formation method has been carried out. In this case, it is dispensed with to add a removal device for the pattern material solution to the film-formation processing apparatus, so that the apparatus can be simplified to reduce or curtail a manufacturing cost.

It is also allowed to employ a construction, in which the step of drying the pattern material solution, and the step of subjecting the film of predetermined pattern to annealing processing are successively performed after the above film formation method has been carried out. Thus, it is possible to obtain the pattern film of desired shape, and to obtain the pattern film having a desired film quality.

It is also allowed to employ a construction, in which the step of removing the pattern material solution having adhered on the mask, and the step of drying the pattern material solution are successively performed after the above film formation method has been carried out.

It is also allowed to employ a construction, in which the step of removing the pattern material solution having adhered on the mask, and the step of subjecting the pattern film to annealing processing are successively performed after the above film formation method has been carried out.

It is also allowed to employ a construction, in which the step of removing the pattern material solution having adhered on the mask, the step of drying the pattern material solution, and the step of subjecting the pattern film to annealing processing are successively performed after the above film formation method has been carried out.

Before the drying step and the annealing processing step stated above, the pattern material solution is in a liquid state and can be easily removed from on the mask. Accordingly, a manufacturing cost can be reduced or curtailed.

It is also allowed to employ a construction, in which the step of removing the pattern material having adhered on the mask is performed after the drying step or the annealing processing step in the film formation method stated above. In this case, the pattern material is removed after having been hardened by the drying step or the annealing processing step, and hence, it is not necessary to add a removal device for the pattern material solution to the film-formation processing apparatus. Accordingly, the apparatus is simplified, and a manufacturing cost can be curtailed.

Incidentally, the pattern material having adhered on the mask is in a solid state, and it can be removed using CMP, ultrasonic waves, or the like.

It is also allowed to employ a construction, in which, before the above film formation method is carried out, the step of preheating the member to-be-processed is performed. Thus, it is possible to shorten a drying time period or an annealing-processing time period, and a manufacturing cost can be curtailed.

The preheating step can be performed by lamp heating or resistance heating.

It is also allowed to employ a construction, in which, before the above film formation method is carried out, a front surface of the mask is subject to processing for repellency to the pattern material solution. Thus, it is possible to shorten a time period for filling up the recess with the pattern material solution, and to shorten a time period for removing the superfluous pattern material solution on the mask. Accordingly, a manufacturing cost can be reduced or curtailed.

In the case of the wet system, the repellency processing step can be performed by dipping processing with a surfactant, such as of anions, nonions or cations, processing with a coupling agent, such as of silane type, aluminate type or titanate type, the formation of a SAM film, or the like. In the case of the dry system, the repellency processing step can be performed by fluorination processing employing a plasma, an electron gun, photoexcitation or the like, the plasma polymerization of a fluorocarbon-resin film, a silicone film or the like, oxidation processing with an ozone gas or the like produced by a plasma, an electron gun, photoexcitation or the like, the evaporation of a coupling agent, such as of silane type, or the like.

It is also allowed to employ a construction, in which, before the above film formation method is carried out, a bottom of the pattern forming recess is subjected to lyophilic processing for the pattern material solution. Thus, a patterning precision is enhanced, and the pattern film of desired shape can be obtained.

In the case of the wet system, the lyophilic processing step can be performed by processing with pure water, oxidation processing with ozone water or the like, processing with an acid such as hydrogen fluoride, processing with an alkali, dipping processing with a surfactant, such as of anions, nonions or cations, processing with a coupling agent, such as of silane type, aluminate type or titanate type, the formation of a SAM film, processing with an organic solvent, or the like. In the case of the dry system, the lyophilic processing step can be performed by ultraviolet processing, oxidation processing with an ozone gas or the like activated by a plasma, an electron gun, photoexcitation or the like, electron-beam irradiation, the evaporation of a coupling agent of silane type or the like, the plasma polymerization of polyethylene or the like, and so forth or the like.

It is also allowed to employ a construction, in which the surface of the mask is subjected to the processing for the repellency to the pattern material solution and the bottom of the pattern forming recess is subjected to the processing for the lyophilic property to the pattern material solution before the above film formation method is carried out. Thus, a manufacturing cost can be curtailed, and the pattern film of desired shape can be obtained.

It is also allowed to employ a construction, in which the step of washing the member to-be-processed is performed before the above film formation method is carried out. Thus, impurities can be prevented from mixing into the pattern film.

In the case of the wet system, the washing step can be performed by washing with pure water, oxidation washing with ozone water or the like, acid/alkali washing (RCA washing), organic washing, light etching with hydrogen fluoride or the like, supercritical processing with carbon dioxide or the like, and so forth. In the case of the dry system, the washing step can be performed by ultraviolet washing, oxidation washing with ozone gas or the like, ashing with a gas or the like activated by a plasma, an electron gun, photoexcitation or the like, and so forth.

It is also allowed to employ a construction, in which the step of removing the unnecessary liquid agent having adhered on the mask is performed before the drying step. The solution in the liquid state before the drying can be easily removed, and a manufacturing cost can be reduced or curtailed.

It is also allowed to employ a construction, in which the step of introducing the hardening agent of the pattern material solution is performed before the drying step. Thus, it is possible to shorten a drying time period, and a manufacturing cost can be reduced or curtailed.

It is also allowed to employ a construction, in which the step of coating the pattern film to-be-formed with an agent to enhance the film quality thereof is performed before the drying step. Thus, it is possible to enhance the film quality simultaneously with the drying, and the pattern film having a desired film quality can be obtained.

It is also allowed to employ a construction, in which the drying step is performed while the surface of the pattern film is being formed into a desired shape by raising a temperature while observing the surface shape of the pattern film.

Since the vaporizing aspect of the solvent contained in the pattern material solution changes depending upon the rising rate of the drying temperature, the pattern film of desired shape can be obtained.

It is also allowed to employ a construction, in which the step of removing the residue of the pattern material on the mask is performed after the drying step. Thus, impurities can be prevented from mixing into the pattern film. Besides, the surface of a structure, serving also as a mask, on the member to-be-processed can be flattened.

It is also allowed to employ a construction, in which the step of removing the unnecessary liquid agent having adhered on the mask is performed before the annealing processing step. The solution in the liquid state before the annealing processing can be easily removed, and a manufacturing cost can be reduced or curtailed.

It is also allowed to employ a construction, in which the step of shaping the surface of a structure on the member to-be-processed is performed before the annealing processing step. Thus, the structure, such as the pattern film or an insulating film serving also as a mask can be formed into a desired shape, and it is possible to remove the residue of the pattern material having adhered on the mask. Accordingly, impurities can be prevented from mixing into the pattern film.

It is also allowed to employ a construction, in which the step of washing the member to-be-processed is performed before the annealing processing step. Thus, impurities can be prevented from mixing into the pattern film.

It is also allowed to employ a construction, in which the step of coating the pattern film with an agent to enhance the film quality thereof is performed before the annealing processing step. Thus, it is permitted to reform the surface layer of the pattern film simultaneously with the annealing processing, and the pattern film having a desired film quality can be obtained.

It is also allowed to employ a construction, in which the annealing processing step is performed in an active gas atmosphere that maintains the film quality of the pattern film. Thus, it is possible to prevent the film quality from changing due to the annealing processing, and the pattern film having a desired film quality can be obtained.

It is also allowed to employ a construction, in which the annealing processing step is performed in an active gas atmosphere that enhances the film quality of the pattern film. Thus, it is possible to enhance the film quality along with the annealing processing, and the pattern film having a desired film quality can be obtained.

It is also allowed to employ a construction, in which the step of shaping the surface of the pattern film is performed after the above film formation method has been carried out. Thus, the pattern film of desired shape can be obtained.

In the case of the wet system, the shaping step can be performed by the removal of a coating film on the upper surface of the mask as based on spin etching or CMP, or the like. In the case of the dry system, the shaping step can be performed by etching-back with a gas activated by a plasma, an electron gun, photoexcitation or the like, and so forth.

It is also allowed to employ a construction, in which the step of reconditioning the pattern film is performed after the above film formation method has been carried out. Thus, the electrical and mechanical damages of the pattern film are compensated for, and the pattern film having a desired film quality can be obtained.

Incidentally, the reconditioning processing step can be performed by microwave heating, high-frequency heating, lamp heating, heater heating, or the like.

It is also allowed to employ a construction, in which the step of subjecting the pattern film to lyophilic processing for a material that is to be subsequently formed into a film is performed after the above film formation method has been carried out. Thus, the adherence of the pattern film to the film layer to be subsequently formed can be enhanced.

In the case of the wet system, the lyophilic processing step can be performed by processing with pure water, oxidation processing with ozone water or the like, acid/alkali processing, dipping processing with a surfactant such as of anions, nonions or cations, processing with a coupling agent, such as of silane type, aluminate type or titanate type, the formation of a SAM film, processing with an organic solvent, or the like. In the case of the dry system, the lyophilic processing step can be performed by ultraviolet processing, oxidation processing with an ozone gas or the like produced by a plasma, an electron gun, photoexcitation or the like, electron-beam irradiation, the evaporation of a coupling agent of silane type or the like, the plasma polymerization of polyethylene or the like, and so forth.

It is also allowed to employ a construction, in which each of the steps stated above is performed in a state where the member to-be-processed is held in an inert gas atmosphere. In this regard, it is also allowed to employ a construction, in which the transfer of the member to-be-processed between the each step is done in the state where the member to-be-processed is held in the inert gas atmosphere. Thus, it is possible to prevent the pattern material from being oxidized and corroded, and the pattern film having a desired film quality can be obtained.

It is also allowed to employ a construction, in which each of the steps stated above is performed in a state where the member to-be-processed is held in an active gas atmosphere. In this regard, it is also allowed to employ a construction, in which the transfer of the member to-be-processed between the each step is done in the state where the member to-be-processed is held in the active gas atmosphere. Thus, it is possible to prevent the pattern material from being oxidized and reduced, and the pattern film having a desired film quality can be obtained.

The step of filling up the recess with the pattern material solution can be performed by spraying the misted pattern material solution onto the surface of said member to-be-processed. Owing to the use of the liquid material, it is possible for this material to directly act on the member to-be-processed, and the washing of the interior of a film-formation processing chamber with any PFC gas as in the conventional art is dispensed with. Moreover, a homogeneous pattern film can be formed on the whole surface of the member to-be-processed.

In this regard, the step of filling up the recess with the pattern material solution can be performed by attracting said pattern material solution, which has been misted by applying a bias voltage, to said member to-be-processed. Thus, a film formation rate is enhanced, and a manufacturing cost can be reduced or curtailed.

The step of filling up the recess with the pattern material solution can be performed by charging said pattern material solution by irradiation of the misted pattern material solution with an electron beam. Thus, a film formation rate is enhanced, and a manufacturing cost can be curtailed. A reaction gas supplied into a processing chamber together with the pattern material solution can be activated by the irradiation with the electron beam, so that the pattern film having a desired film quality can be obtained.

Incidentally, the step of filling up the recess with the pattern material solution can be performed by rotating said member to-be-processed. Thus, the step of etching back the pattern film having adhered on the mask can be omitted, so that a manufacturing cost can be reduced or curtailed.

It is also allowed to employ a construction, in which the various steps stated above are performed in an identical apparatus. A manufacturing cost can be curtailed by performing the various steps in an identical processing chamber.

A device according to the present invention is so constructed as to be manufactured using the above film formation method. Thus, the device can be manufactured with the above advantages.

A method of manufacturing a device according to the present invention includes a method of manufacturing a device, which includes the film formation step of forming a thin film on a member to-be-processed, and the method being so constructed that the film formation step fills up a pattern forming recess formed by a mask at a front surface of the member to-be-processed with a pattern material solution by employing the above film formation method. Thus, the device can be manufactured with the above advantages.

BRIEF DESCRIPTION OF THE DRAWINGS

FIGS. 6(1)–6(4) are schematics of a second process of the film formation method according to the first exemplary embodiment;

FIGS. 7(1) and 7(2) are schematics of the correlation between the rising rate of a drying temperature and the surface shape of a pattern film;

FIGS. 9(1)–9(3) are schematics of a first process of a film formation method according to a second exemplary embodiment;

FIGS. 10(1)–10(3) are schematics of a second process of the film formation method according to the second exemplary embodiment;

FIGS. 12(1)–12(3) are schematics of a first process of a film formation method according to a third exemplary embodiment;

FIGS. 13(1)–13(3) are schematics of a second process of the film formation method according to the third exemplary embodiment;

FIGS. 14(1)–14(3) are schematics of a first process view showing a related art patterning process;

FIGS. 15(1)–15(3) are schematics of a second process showing the related art patterning process;

DETAILED DESCRIPTION OF PREFERRED EMBODIMENTS

Exemplary embodiments of a film formation method according to the present invention, a device manufactured by employing the method, and a method of manufacturing a device are described in detail below with reference to the accompanying drawings. Described below are merely aspects of the exemplary embodiments of the present invention, and the present invention shall not be restricted to them.

Figure 1:
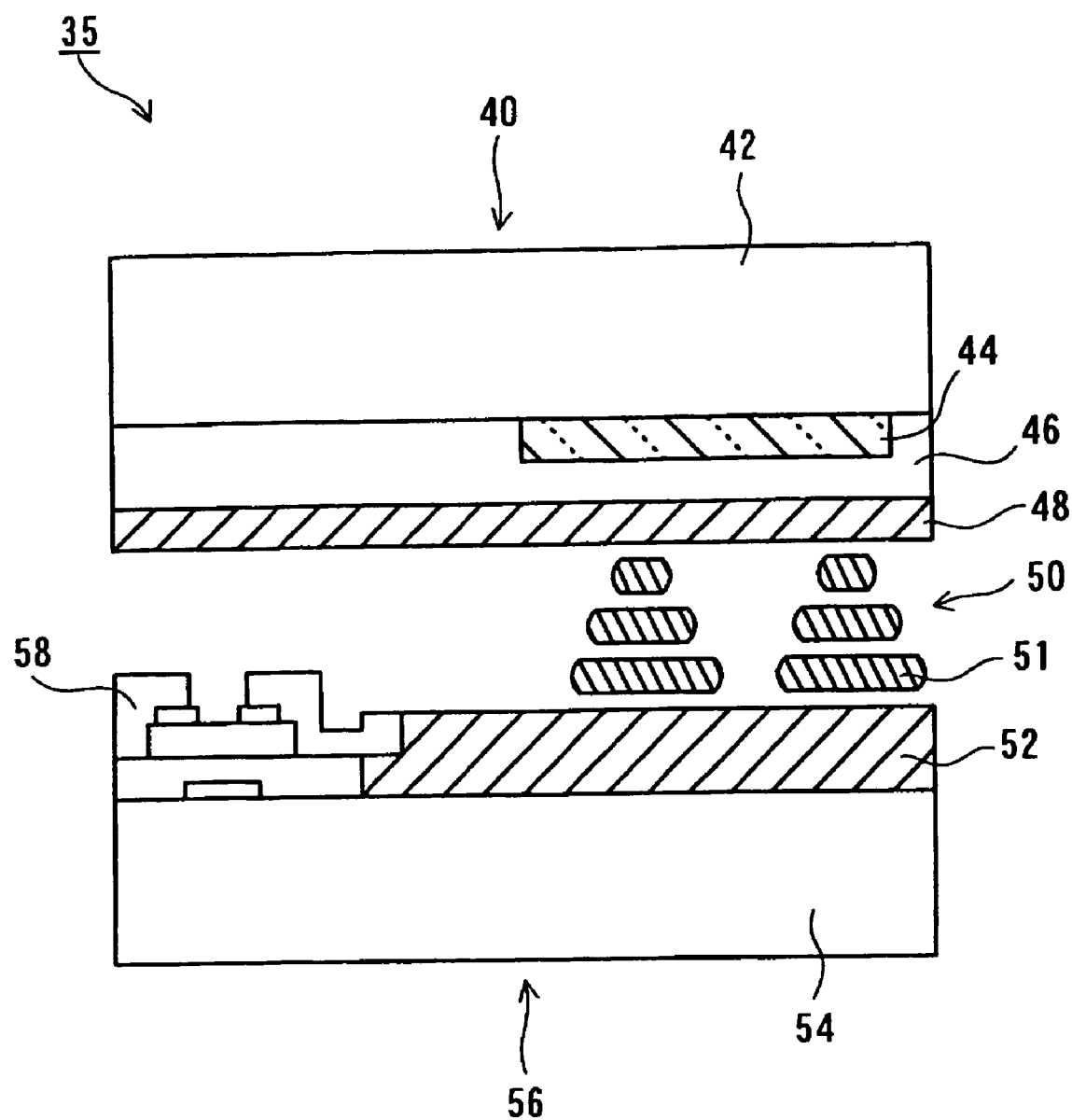
FIG. 1 is a schematic of a liquid-crystal display device.

The first exemplary embodiment is described below. As shown in FIG. 1, the film formation method according to the first exemplary embodiment forms a film of ITO (Indium Tin Oxide) on the front surface of a member to-be-processed, such as glass substrate, as the display electrode 52 of a liquid-crystal display device 35.

Films of ITO can be utilized as the display electrodes and common electrode of a liquid-crystal display device. FIG. 1 shows the liquid-crystal display device. FIG. 1 is a side sectional view corresponding to one pixel of the liquid-crystal display device. The liquid-crystal display device 35 is chiefly constructed of a TFT array substrate 56, a color filter substrate 40, and a liquid crystal layer 50. The TFT array substrate 56 is such that a TFT 58 which is a liquid-crystal driving switching element, the display electrode 52, etc. are formed on the glass substrate 54. The color filter substrate 40 is such that a color filter 44 and a protective film 46 are formed on a glass substrate 42, and that the common electrode 48 is further formed on the front surface of the protective film 46. The liquid crystal layer 50 is formed in such a way that, after the TFT array substrate 56 and the color filter substrate 40 are stuck together with a sealant (not shown), a liquid crystal is injected into the interspace between the substrates. When a voltage is applied across the display electrode 52 and the common electrode 48, the re-orientation of liquid crystal molecules 51 takes place so as to transmit or intercept light. The liquid-crystal display device displays an image by performing the above operation as to each pixel thereof.

The films of ITO being transparent conductive films are respectively utilized as the display electrode 52 and common electrode 48 of the liquid-crystal display device stated above. The ITO is indium oxide ($In_2O_3$) doped with 1 to 5 weight-% of tin oxide ($SnO_2$). In a case where the film of the ITO is formed by an LSMCD method to be stated later, it is possible to use a pattern material solution in which the ultra-fine particles (particle diameters: 0.1 μm or less) of the ITO are dispersed in an organic solvent. It is also possible to use a pattern material solution (with 2 to 10% of tin (Sn) added) in which dibutyltin diacetate (DBTDA) and indium acetylacetonate (InAA) are dissolved in an organic solvent. Acetylacetone, isopropylbiphenyl or the like is usable as the organic solvent, and it is diluted to a concentration of about 0.2 mol/L in use.

The ITO film, which is used as the display electrode of the liquid-crystal display device, should preferably have a lower electric resistance and a higher light transmission factor. Incidentally, the ITO film can have its electric resistance and light transmission factor adjusted by adjusting the proportion of the oxides contained therein. In general, when the proportion of the oxides is high, the light transmission factor heightens, and when the proportion of the oxides is low, the electric resistance lowers. In this regard, when fluorine radicals are introduced into the ITO under film formation, the proportion of the oxides decreases to lower the electric resistance. When ozone radicals are introduced, the proportion of the oxides increases to heighten the light transmission factor. The fluorine radicals and the ozone radicals can be produced by activating carbon tetrafluoride ($CF_4$) gas or the like and oxygen gas or the like, respectively. Accordingly, the film quality of the ITO film can be improved using the carbon tetrafluoride gas or the like and the oxygen gas or the like as reaction gases.

Figure 2:
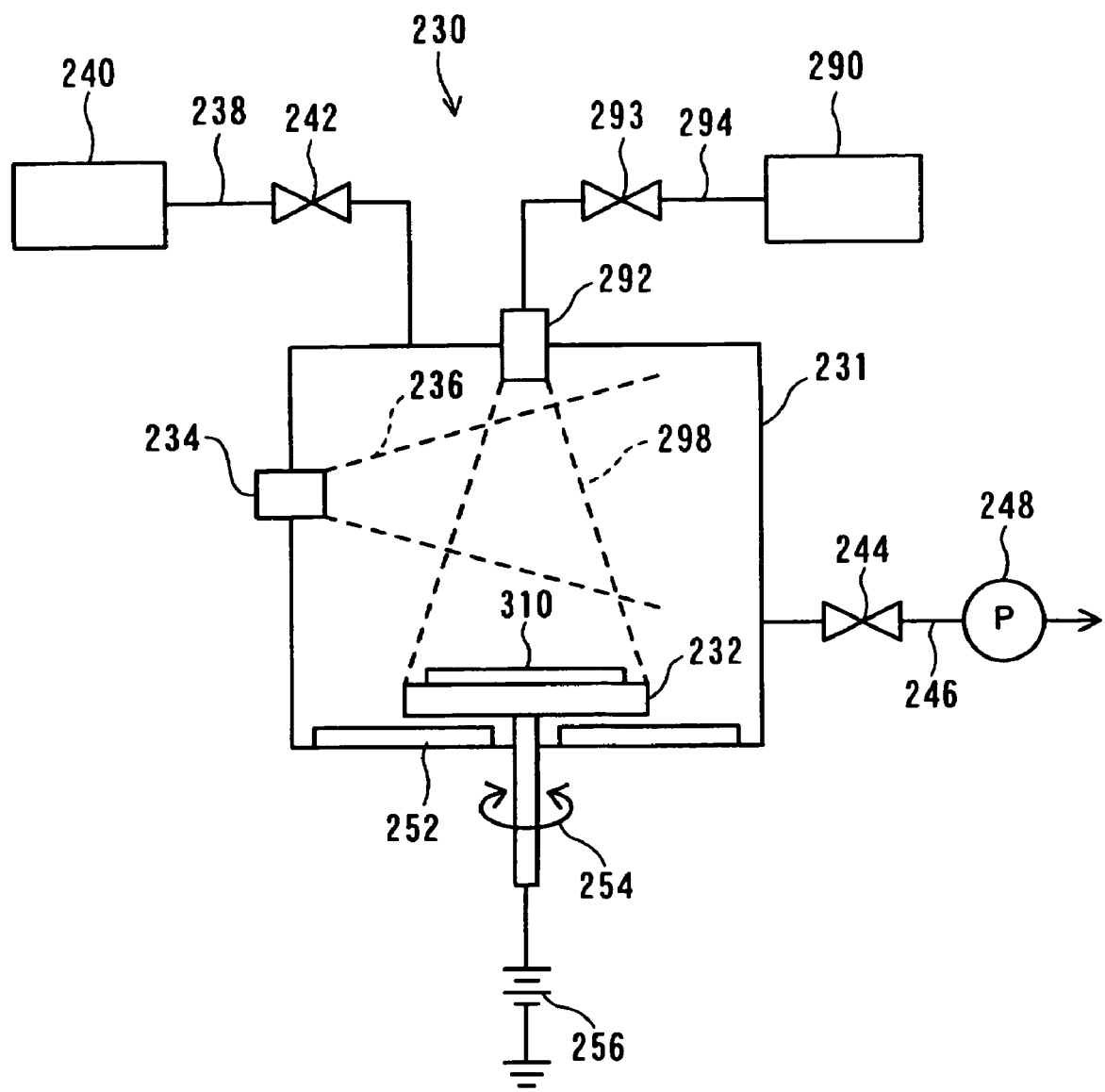
FIG. 2 is a schematic of a film-formation processing apparatus.

A film-formation processing apparatus as stated below is used to form the ITO film on the surface of the member to-be-processed. FIG. 2 shows the film-formation processing apparatus. The film-formation processing apparatus 230 has a processing chamber 231, and the member to-be-processed 310, such as glass substrate, is arranged on a processing stage 232 disposed in the processing chamber 231. A heating device 252 is disposed under the processing stage 132 so as to permit the temperature regulation of the member to-be-processed 310. Incidentally, a halogen lamp or the like may well be disposed over the processing stage so as to permit the temperature regulation of the member to-be-processed. Further, the processing stage 232 is formed so as to be rotatable within a horizontal plane as indicated by an arrow 254, whereby the member to-be-processed 310 is made rotatable. In addition, the processing stage 232 is connected to a DC or AC power source 256, whereby the surface of the member to-be-processed 310 is made chargeable.

On the other hand, a nozzle 292 is disposed at the ceiling part of the processing chamber 231 in opposition to the processing stage 232 to arrange the member to-be-processed 310 thereon. The nozzle 292 is connected to a pattern-material-solution supply portion 290 through a supply pipe 294 furnished with a flow control valve 293, and it can mist the pattern material solution 298 from the pattern-material-solution supply portion 290 so as to spray the solution mist onto the member to-be-processed 310 arranged on the processing stage 232. A reaction-gas supply portion 240 is connected to the upper part of the processing chamber 231 through a supply pipe 238 furnished with a flow control valve 242, and it can supply the reaction gas into the processing chamber 231. Further, one end of an exhaust pipe 246 furnished with an exhaust valve 244 is connected to the lower part of the processing chamber 231, and the interior of the processing chamber 231 can be evacuated by an evacuation pump 248 connected to the other end of the exhaust pipe 246. An exhaust gas emitted by the evacuation pump 248 is sent to a removal apparatus (not shown) as may be needed.

An electron-beam irradiation unit (electron-beam irradiation pipe) 234 is disposed somewhat below the nozzle 292 and sideward of the stream of the pattern material solution 298. In case of this exemplary embodiment, "Min-EB" manufactured by Ushio Inc. and having an acceleration voltage of 30 to 75 kV is employed as the electron-beam irradiation unit 234, and an electron beam 236 can be taken out from the irradiation window of the unit at the distal end thereof into the atmospheric air. Herein, as shown in FIG. 2, the electron-beam irradiation unit 234 projects the electron beam 236 while crossing the direction of the stream of the pattern material solution 298 jetted from the nozzle 292, whereby the pattern material solution 298 immediately after being jetted from the nozzle 292 and the reaction gas can be irradiated with the electron beam 236.

In the first exemplary embodiment, in order to form the ITO film of predetermined pattern, a film of resist is formed as the mask of parts other than a pattern forming part. The resist is a high-polymer coating material, the solubility of which in a developing solution, etc. are changed by irradiation with light, an electron beam, X-rays, an ion beam, or the like, and which is subjected to patterning. Incidentally, there are a positive type resist which becomes easy of solving by the irradiation with the light or the like, and a negative type resist which becomes difficult of solving.

A fluorocarbon-resin polymerization film having repellency to the pattern material solution is formed on the surface of the resist film. A liquid organic substance made of a straight-chain PFC, such as Fluorinert ($C_8F_{18}$) is used as the raw material liquid of the polymerization film. When the gas of the straight-chain PFC is turned into a plasma, some of principal chains are severed and becomes active, and the active PFC gas having reached the surface of the resist film is polymerized to form the fluorocarbon-resin polymerization film on the surface of the resist film.

The maintaining a discharge is difficult with the PFC of large molecular weight, and it is therefore facilitated by adding a rare gas such as Ar. Also, in a case where the raw material liquid of the repellency processing is fluorocarbon, it is possible to add the PFC having a molecular weight smaller than that of the raw material liquid, for example, $CF_4$. Owing to the addition of the activated $CF_4$, even when the fluorine of the fluorocarbon has partly separated, active fluorine is accepted into the polymerization film, and hence, the repellency of the polymerization film can be enhanced. Favorably, the fluorocarbon-resin polymerization film is formed by combining a plurality of such contrivances.

Incidentally, apart from the fluorocarbon-resin polymerization film, an organic film of, for example, polyimide can be formed, thereby to perform the repellency processing. However, since the fluorocarbon-resin polymerization film contains fluorine atoms, it is superior in point of having high degrees of repellency to all sorts of liquids. Alternatively, the fluorocarbon-resin polymerization film may well be formed on the parts of the surface of the member to-be-processed except the pattern forming part thereof, directly without forming the resist film. It is also possible to omit the formation of the fluorocarbon-resin polymerization film in such a way that a resist material, in which a fluorocarbon resin is mixed, is used to form a resist film whose material itself has repellency.

Figure 3:
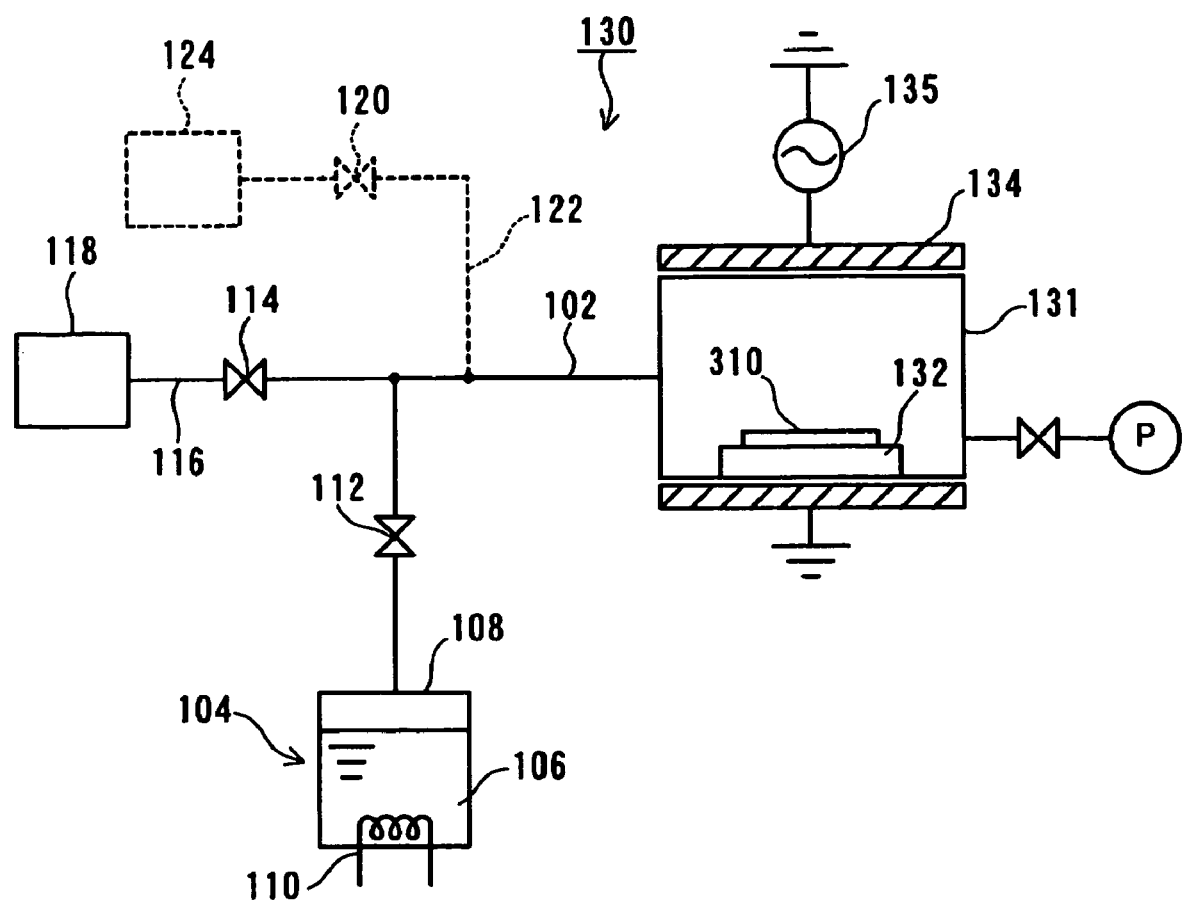
FIG. 3 is a schematic of a polymerization-film formation apparatus.

A polymerization-film formation apparatus as stated below is used for the formation of the fluorocarbon-resin polymerization film. FIG. 3 shows the polymerization-film formation apparatus. The repellency processing apparatus 130 has a processing chamber 131, and a member to-be-processed 310, such as glass substrate, is arranged on a processing stage 132 disposed in the processing chamber 131. High-frequency electrodes 134 are mounted on the top and bottom of the processing chamber 131, and they are connected to a high-frequency power source 135.

A processing-gas supply portion 104 is connected to the processing chamber 131 through a supply pipe 102 furnished with a flow control valve 112. The processing-gas supply portion 104 has a vessel 108, in which a liquid organic substance 106 made up of a straight-chain PFC such as $C_4F_{10}$ or $C_8F_{18}$ is reserved. The vessel 108 is provided with a heater 110 serving as a heating part, whereby the liquid organic substance 106 can be heated to vaporize. Besides, a carrier-gas supply portion 118 is connected to the downstream of the flow control valve 112 of the supply pipe 102, through a carrier pipe 116 furnished with a flow control valve 114. An inert gas such as nitrogen or argon is used as a carrier gas.

As indicated by broken lines in FIG. 3, a second-processing-gas supply portion 124 can also be connected to the supply pipe 102 through a pipe 122 having a flow control valve 120. In this case, $CF_4$ is added as a second processing gas from the second-processing-gas supply portion 124 into the vapor of the liquid organic substance 106. In the processing chamber 131, a mixed gas consisting of the organic substance vapor and the $CF_4$ is turned into a plasma. Then, activated fluorine reacts with the vapor of the liquid organic substance 106, and is accepted into fluorine separation parts in a film polymerized on the surface of the member to-be-processed 310, whereby the repellency of the polymerization film can be enhanced.

With the above polymerization-film formation apparatus, the fluorocarbon-resin polymerization film is formed even on the pattern forming part of the surface of the member to-be-processed. Therefore, the pattern forming part is irradiated with ultraviolet radiation in order to render lyophilic for the pattern material solution. The ultraviolet radiation severs the bonds of the polymerization film formed and decomposes this polymerization film, and it also decomposes and removes the resist and the like organic substances having adhered to the pertinent part. Thus, the part irradiated with the ultraviolet radiation is rendered lyophilic. Incidentally, an ultraviolet irradiation mask, which has a light transmitting property at only its part corresponding to the pattern forming part, is used in order to irradiate only the pattern forming part with the ultraviolet radiation. The fluorocarbon-resin polymerization film can be decomposed by irradiating it with electromagnetic waves other than the ultraviolet radiation, for example, a laser beam or X-rays. However, since the ultraviolet radiation is inexpensive, safe and easy of handling, it is superior to the other electromagnetic waves.

Figure 4:
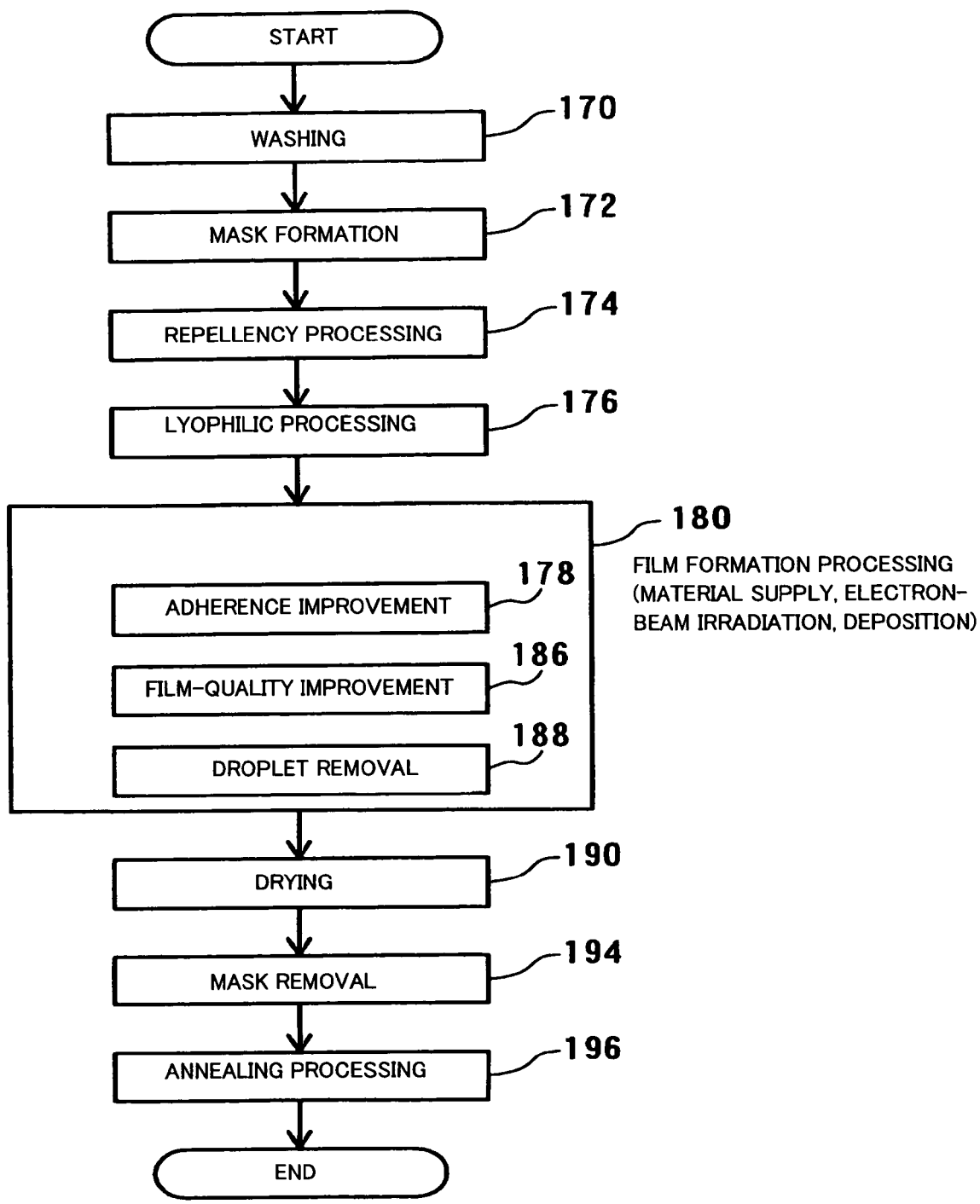
FIG. 4 is a flow chart of a film formation method according to a first exemplary embodiment.
Figure 5:
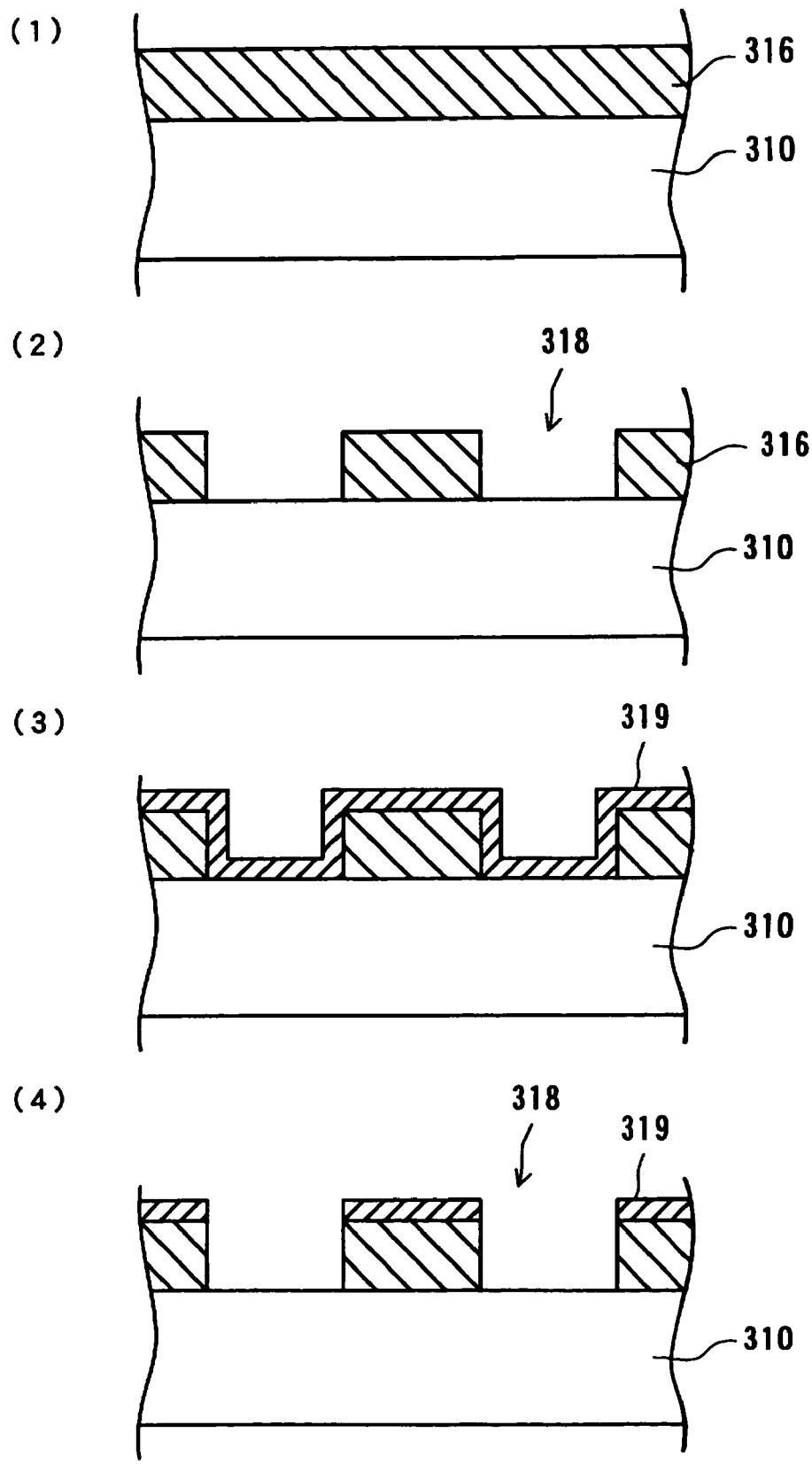
FIGS. 5(1)–5(4) are schematics of a first process of the film formation method according to the first exemplary embodiment.

Next, the individual steps of the film-formation processing method according to the first exemplary embodiment are described in detail below in the order of the steps. The flow chart of the film formation method according to the first exemplary embodiment is shown in FIG. 4. The process views of the film formation method according to the first exemplary embodiment are shown in FIGS. 5(1)–FIG. 6(4). In the first exemplary embodiment, there is exemplified a case where pattern films of ITO are formed on the front surface of a glass substrate as the display electrode patterns of a liquid-crystal display device.

First, the surface of the member to-be-processed is washed (washing step, S170). Especially in a case where the member to-be-processed has been in a processing standby state, impurities might be adherent to the surface. The member to-be-processed is washed in order to prevent the impurities from mixing into the pattern films, which are to be formed on the surface of the member to-be-processed.

Subsequently, a mask is formed on the surface of the member to-be-processed (mask formation step, S172).

Concretely, as shown in FIG. 5(1), a resist film 316 is first formed on the whole surface of the member to-be-processed 310, such as glass substrate (resist coating step). The thickness of the resist film 316 is set at or above the height of the display electrode patterns to-be-formed. Subsequently, as shown in FIG. 5(2), recesses 318 for forming the display electrode patterns are formed in the resist film 316 (exposure/developing step). Concretely, a photo-mask (not shown) in which the display electrode patterns are lithographed is arranged over the resist film 316, and the resist film 316 is exposed to light and subjected to developing, whereby parts of the resist film, at which the display electrode patterns are to be formed, are removed to form the recesses 318.

Subsequently, the surface of the resist film 316 is subjected to repellency processing (repellency processing step, S174). Concretely, as shown in FIG. 5(3), a fluorocarbon-resin polymerization film 319 is formed on the surface of the resulting member to-be-processed 310. First, in the polymerization-film formation apparatus 130 shown in FIG. 3, the member to-be-processed 310 formed with the resist film is arranged on the processing stage 132 in the processing chamber 131. Subsequently, the liquid organic substance 106 within the vessel 108 in the processing-gas supply portion 104 is heated by the heater 110 so as to vaporize this liquid organic substance 106. Besides, the carrier gas such as nitrogen is caused to flow from the carrier-gas supply portion 118 into the supply pipe 102, thereby to transfer the vapor of the liquid organic substance 106 into the processing chamber 131. Subsequently, high-frequency power is applied to the vapor of the liquid organic substance 106 introduced into the processing chamber 131 by the high-frequency power source 135 and the high-frequency electrodes 134. Then, the straight-chain organic substance has some of its bonds severed and becomes active, and the active organic-substance vapor having reached the surface of the member to-be-processed 310 is polymerized, so that the polymerization film of the organic substance having a repellency is formed on the whole surface of the member to-be-processed 310. Incidentally, the polymerization film is formed to be about 100 angstroms thick.

By the way, in the above, the vapor of the liquid organic substance introduced into the processing chamber is activated by applying the high-frequency power thereto, but it may well be activated by irradiation with an electron beam, irradiation with ultraviolet radiation, or the like. Alternatively, the repellency can be afforded by processing the surface of the member to-be-processed with an acid.

At the repellency processing step stated above, the fluorocarbon-resin polymerization film is formed even in the recesses 318 to form the display electrode patterns, and hence, lyophilic processing is performed for the recesses 318 (lyophilic processing step, S176). Concretely, as shown in FIG. 5(4), the recesses 318 are irradiated with ultraviolet radiation, thereby to remove the fluorocarbon-resin polymerization film 319. First, an ultraviolet irradiation mask, which has a light transmitting property at only its parts corresponding to the display-electrode-pattern forming parts, is arranged over the member to-be-processed, whereupon the resulting member to-be-processed is irradiated with the ultraviolet radiation. Then, the ultraviolet radiation severs the bonds of the fluorocarbon-resin polymerization film, and the fluorocarbon-resin polymerization film 319 formed in the recesses 318 is removed. Moreover, a resist and the like organic substances having adhered in the recesses 318 are decomposed and removed. Owing to the above processing, a lyophilic property is afforded to the display-electrode-pattern forming parts.

The polymerization film, etc. may well be burnt to promote the removal, in such a way that the member to-be-processed is exposed to activated ozone gas or oxygen gas simultaneously with the irradiation with the ultraviolet radiation. The lyophilic property may well be afforded to the display-electrode-pattern forming parts by merely exposing the member to-be-processed to the activated ozone gas or oxygen gas. As a further expedient, the lyophilic property can be afforded by processing the surface of the member to-be-processed with an alkali solvent such as NaOH or KOH. In this case, an oxide film, etc. on the surface of the member to-be-processed are removed by alkali, while at the same time, OH-radicals adhere onto the surface of the member to-be-processed, whereby the lyophilic property is afforded.

By the way, in a case where the organic solvent of a pattern material solution is octane or the like, adherence enhancement processing based on a nonionic surfactant (adherence improvement step, S178) is performed in addition to the above. Concretely, the surface of the member to-be-processed is coated with an aqueous solution containing 1% of nonionic surfactant (RO—(CH$_2$CH$_2$O)nH), whereby the adherence of the member surface with the pattern material solution is enhanced. Incidentally, the coating with the nonionic surfactant may be performed in the film-formation processing chamber immediately before a film-formation processing step to be stated below, or it may well be performed in another processing chamber. Adherence enhancement processing, such as irradiation with ultraviolet radiation, for the member to-be-processed, can be performed in the film-formation processing chamber together with the film-formation processing step.

Subsequently, as shown in FIG. 6(1), the recesses to form the display electrode patterns are filled up with the pattern material solution (film-formation processing step, S180). Concretely, in the film-formation processing apparatus 230 shown in FIG. 2, the member to-be-processed 310 having undergone the above processing steps is arranged on the processing stage 232 in the processing chamber 231. Subsequently, the pattern material solution is misted by the nozzle 292, and the resulting mist is supplied into the processing chamber 231 (material supply step).

Incidentally, film-quality enhancement processing can also be performed by supplying a reaction gas into the processing chamber 231, simultaneously with the supply of the pattern material solution (film-quality enhancement step, S186).

Concretely, the reaction gas is mixed into the misted pattern material solution and is supplied into the processing chamber 231. When carbon tetrafluoride gas, oxygen gas or the like is used as the reaction gas, the proportion of the oxides of the ITO film to be formed can be adjusted. Incidentally, the film-quality enhancement step may be performed in the film-formation processing chamber together with the film-formation processing step, or it may well be performed in another processing chamber together with an annealing processing step.

Subsequently, the pattern material solution and the reaction gas, supplied into the processing chamber 231, are irradiated with an electron beam by the electron-beam irradiation pipe 234 (electron-beam irradiation step). Then, the projected electron beam impinges on the molecules of the reaction gas, and the reaction gas turns into a plasma state, so that excited active species such as radicals are produced. The projected electron beam impinges also on the misted pattern material solution, and charges the droplets of the solution negatively.

By the way, in the above, the reaction gas and the pattern material solution introduced into the processing chamber 231 are activated by irradiating them with the electron beam, but they may well be activated by applying high-frequency power to them or irradiating them with ultraviolet radiation.

Subsequently, the pattern material solution is deposited onto the surface of the member to-be-processed 310 (deposition step). Although the pattern material solution can be deposited onto the surface of the member to-be-processed 310 even by free fall, a bias voltage of, for example, 10 kV is applied to the processing stage 232 so as to charge the surface of the member to-be-processed 310 positively, whereby the negatively charged droplets of the pattern material solution can be attracted and deposited. Incidentally, when the pattern material solution is misted, it is naturally charged negatively, so that the droplets, not having impinged against the electron beam, can also be attracted to the member to-be-processed 310 so as to be deposited. The deposition of the droplets can be promoted by cooling the member to-be-processed 310.

Here, when the member to-be-processed 310 is rotated within a horizontal plane, the superfluous droplets of the pattern material solution deposited on the resist film can be centrifugally removed (droplet removal step, S188). Since the surface of the resist film has been subjected to the repellency processing, the droplets are not secured onto the resist film and move so as to slide on the resist film. In contrast, since the recesses to form the display electrode patterns have been subjected to the lyophilic processing, the droplets adhere into any recesses not filled up. In the absence of any recesses not filled up, the droplets move to the edge of the member to-be-processed 310 and fall outside this member. In this way, the recesses to form the display electrode patterns are uniformly filled up with the pattern material solution, and the droplets of the pattern material solution deposited on the resist film are removed.

Apart from the rotation of the member to-be-processed, a gas can be blown against the surface of the member to-be-processed, thereby to remove the droplets of the pattern material solution deposited on the resist film. Also, the droplets of the pattern material solution deposited on the resist film can be removed by inclining the member to-be-processed. The droplet removal step may be performed in the film-formation processing chamber together with the film-formation processing step, or it may well be performed in another processing chamber after the film-formation processing step.

Alternatively, the superfluous pattern material solution is not removed at this stage, but the pattern material solution solidified after a drying step or the annealing step as described below can be removed by CMP, ultrasonic waves, or the like.

Subsequently, the member to-be-processed is heated to dry the pattern material solution (drying step, S190). Concretely, as shown in FIG. 6(2), the organic solvent of the pattern material solution is vaporized. It is favorable that the interior of the processing chamber is brought into a lowered pressure state in order to promote the vaporization of the organic solvent, and that the drying is performed in an inert gas atmosphere in order to prevent the pattern material from being oxidized by the heating. In order to avoid the occurrence of voids in the pattern films, a drying temperature is set at a temperature equal to or lower than the boiling point of the organic solvent. By way of example, in a case where the organic solvent is octane, the boiling point thereof is about 170° C., and hence, the member to-be-processed is heated at or below 150° C. in a nitrogen atmosphere for 5 minutes or more. Thus, the ITO films are formed as the pattern films 320. Alternatively, the drying may well be performed while the member to-be-processed is being tentatively baked in the atmosphere of a reactive gas or an activated reaction gas. The drying step may be performed in the film-formation processing chamber together with the film-formation processing step, or it may well be performed in another processing chamber after the film-formation processing step.

The surface of each pattern film can be formed into a desired shape by controlling a temperature rising rate at the drying step. FIGS. 7(1) and 7(2) show the correlation between the rising rate of the drying temperature and the surface shape of the pattern film. After the film formation step being a preceding step has ended, the member to-be-processed is in a state where, as shown in FIG. 7(1), each recess 318 of the resist film 316 is filled up with the pattern material solution 321. Subsequently, when the temperature is rapidly raised at the drying step, the solvent contained in the pattern material solution 321 is vaporized chiefly from the central part of this solution. As a result, a pattern film 320a after the drying is formed into a state where the central part is depressed. In contrast, when the temperature is slowly raised at the drying step, the solvent contained in the pattern material solution 321 is vaporized equally from the whole solution. Accordingly, a pattern film 320b after the drying is formed into a state where the central part is round out as shown in FIG. 7(2). Therefore, the surface of the pattern film can be formed into the desired shape by raising the drying temperature while observing the surface shape of the pattern film. Incidentally, the surface of the pattern film can also be formed into a flat shape as the intermediate shape between the shapes of FIGS. 7(1) and 7(2).

Subsequently, the annealing processing (baking) of the pattern films and the removal of the resist film are carried out.

First, the annealing processing temperature of the pattern films and the hardening temperature of the resist are compared. In a case where the hardening temperature of the resist is higher than the annealing processing temperature of the pattern films, the drying step is followed by the annealing processing step. The annealing processing step in this case may be performed in the film-formation processing chamber together with the film-formation processing step, or it may well be performed in another processing chamber after the film-formation processing step.

In contrast, in a case where the hardening temperature of the resist is lower than the annealing processing temperature of the pattern films, the resist is hardened in the course of the annealing processing, and the removal of the resist becomes difficult. Therefore, the resist removal step is performed earlier and is followed by the annealing processing step. Incidentally, the hardening temperature of PMMA being a typical resist is about 120° C., and the annealing processing temperature of the ITO films is above 500° C., so that the drying step is performed earlier, whereupon the resist removal step is performed, and is followed by the annealing process.

In a case where the surface of each pattern film 320 needs to be shaped, shaping working as shown in FIG. 6(3) can be performed (shaping step) before the resist removal step. Concretely, the pattern film is worked down to a desired thickness by CMP (chemical mechanical polishing) or the like. On that occasion, the surroundings of the pattern film 320 are protected by the resist 316, and hence, the pattern film 320 is seldom deformed or damaged.

The residue of the pattern material solution existing on the surface of the fluorocarbon-resin polymerization film 319 and the fluorocarbon-resin polymerization film 319 itself are simultaneously removed along with the shaping working.

Subsequently, the resist film 316 is removed (mask removal step, S194). The resist removal step is performed by heating the member to-be-processed 310 in the atmosphere of oxygen gas or activated oxygen gas.

Subsequently, the annealing processing (baking) of the pattern films is performed by heating the member to-be-processed (annealing processing step, S196). The annealing processing step may be performed in atmospheric air, or it may well be performed in an inert gas atmosphere in order to prevent the pattern films from being oxidized by the heating. In the case of the ITO films, they are subjected to the annealing processing at or above 500° C. in a nitrogen atmosphere. In a case where the annealing processing is performed at a low temperature (400° C. or less), the film quality can be enhanced simultaneously with the annealing processing in the atmosphere of an activated gas such as fluorine radicals or ozone radicals.

Owing to the above, as shown in FIG. 6(4), the display electrode patterns 314 are formed of the pattern films 320 of ITO on the surface of the member to-be-processed 310.

With the film formation method according to the first exemplary embodiment described above, the related art step of removing the pattern material formed on the surface of the member to-be-processed is changed into the step of sticking/embedding the pattern material into the recesses, so that all the above steps can be performed in an environment under the atmospheric pressure or under a pressure near the atmospheric pressure. Therefore, vacuum facilities need not be disposed, and it is possible to save energy for operating the facilities. Accordingly, a manufacturing cost can be curtailed.

The exemplary embodiment is so constructed that the pattern films are formed by spraying the misted pattern material solution onto the surface of the member to-be-processed (LSMCD method). Owing to the use of the liquid material, it is possible to form the films only on the member to-be-processed, and a job in the related art, in which films formed on the walls of the film-formation processing chamber are removed by a PFC gas, is dispensed with. Moreover, owing to the misting, the particle diameters of the pattern material solution can be made as small as about 0.2 µm, so that the pattern material solution is excellent in step coverage and trench embodment, and can form the microscopic pattern films having, for example, submicron widths (1 µm or less). Further, since the misted particles are naturally charged, a film formation rate can be enhanced as stated below. In addition, the homogeneous pattern films can be formed on the whole surface of the member to-be-processed by spraying the misted pattern material solution.

The exemplary embodiment is so constructed that the pattern films are formed by applying the bias voltage to the member to-be-processed and attracting the misted pattern material solution. Thus, the film formation rate is enhanced, and the manufacturing cost can be curtailed.

The exemplary embodiment is so constructed that the pattern films are formed by irradiating the misted pattern material solution with the electron beam and charging the pattern material solution. Thus, the film formation rate is enhanced, and the manufacturing cost can be curtailed. Incidentally, owing to the irradiation with the electron beam, the reaction gas supplied into the processing chamber together with the pattern material solution can be activated, so that the pattern films having a desired film quality can be obtained.

The exemplary embodiment is so constructed that the pattern films are formed by rotating the member to-be-processed. Thus, it is possible to easily remove the pattern material solution adherent on the mask, and the step of etching back the pattern films can be omitted, so that the manufacturing cost can be curtailed.

The exemplary embodiment is so constructed that the surface of the mask is subjected to the processing for the repellency to the pattern material solution before the film formation. Thus, it is permitted to shorten a time period to fill up the recesses with the pattern material solution, and to shorten a time period to remove the superfluous pattern material solution on the mask. Accordingly, the manufacturing cost can be curtailed.

The exemplary embodiment is so constructed that the bottoms of the pattern forming recesses are subjected to the lyophilic processing for the pattern material solution before the film formation. Thus, a patterning precision is enhanced, and the pattern films of desired shape can be obtained.

Next, a second exemplary embodiment will be described. As shown in FIG. 10(3), a film formation method according to the second embodiment forms a wiring pattern 14 to electrically connect semiconductor elements (not shown), on the front surface of a member to-be-processed 10, such as wafer substrate. Incidentally, portions constructed similarly to those of the first exemplary embodiment are omitted from description.

Used as a pattern material solution for the wiring line in the second exemplary embodiment is a solution, in which the ultra-fine particles of a metal, such as Au, Ag, Cu or Al or any compound of the metal are/is dispersed in an organic solvent, a solution in which a conductive organic substance such as polyaniline or polypyrrole is dissolved in an organic solvent, or the like. Used as the organic solvent is one of an acrylic resin, butyl acetate, etc., or two or more of them as mixed.

As an example, there is described below a case of using the organic solvent solution of copper acetate (chemical formula: $Cu(CH_3COO)_2 \cdot H_2O$) as the pattern material solution for the wiring line, and forming the wiring pattern made of metal copper. Apart from the acrylic resin or butyl acetate mentioned above, one kind or any mixture of water, alcohols, ethers, organic esters, and ketone, or the like is usable as the organic solvent.

Since the copper acetate has a composition containing oxygen, copper oxide (CuO) is liable to be formed in baking the metal copper. The copper oxide forms a cause for raising a wiring resistance, and accordingly needs to be eliminated. Therefore, the metal copper is baked in such a way that hydrogen gas is used as a reaction gas and is turned into a plasma, thereby to produce hydrogen radicals, and that the copper oxide is reduced in accordance with the following reaction formula:

[Chemical Formula 1]

Even in a case where copper dioxide ($CuO_2$) has been formed during the hot baking, the hydrogen radicals reduces the copper dioxide in accordance with the following chemical formula, and the metal copper is baked:

[Chemical Formula 2]

Incidentally, the reaction gas may be any reductant, and any of chlorine gas, a fluoric gas, carbon monoxide gas, etc. can also be used.

Meanwhile, it is the same as in the first exemplary embodiment that, in order to form the wiring pattern by the metal copper film, a resist film is formed on parts other than a wiring pattern forming part and is used as a mask. The front surface of the mask should preferably be subjected to repellency processing. In this regard, as in the first exemplary embodiment, it is also possible that a fluorocarbon-resin polymerization film having a repellency is formed on the whole surface of the member to-be-processed, and that it is thereafter irradiated with ultraviolet radiation so as to remove the fluorocarbon-resin polymerization film of the wiring pattern forming part. In the second exemplary embodiment, however, there is described a method in which, in order to decrease the number of steps, the repellency by fluorinating is selectively afforded only on the surface of the resist film. A surface reformation apparatus as stated below is used for performing such a method.

Figure 8:
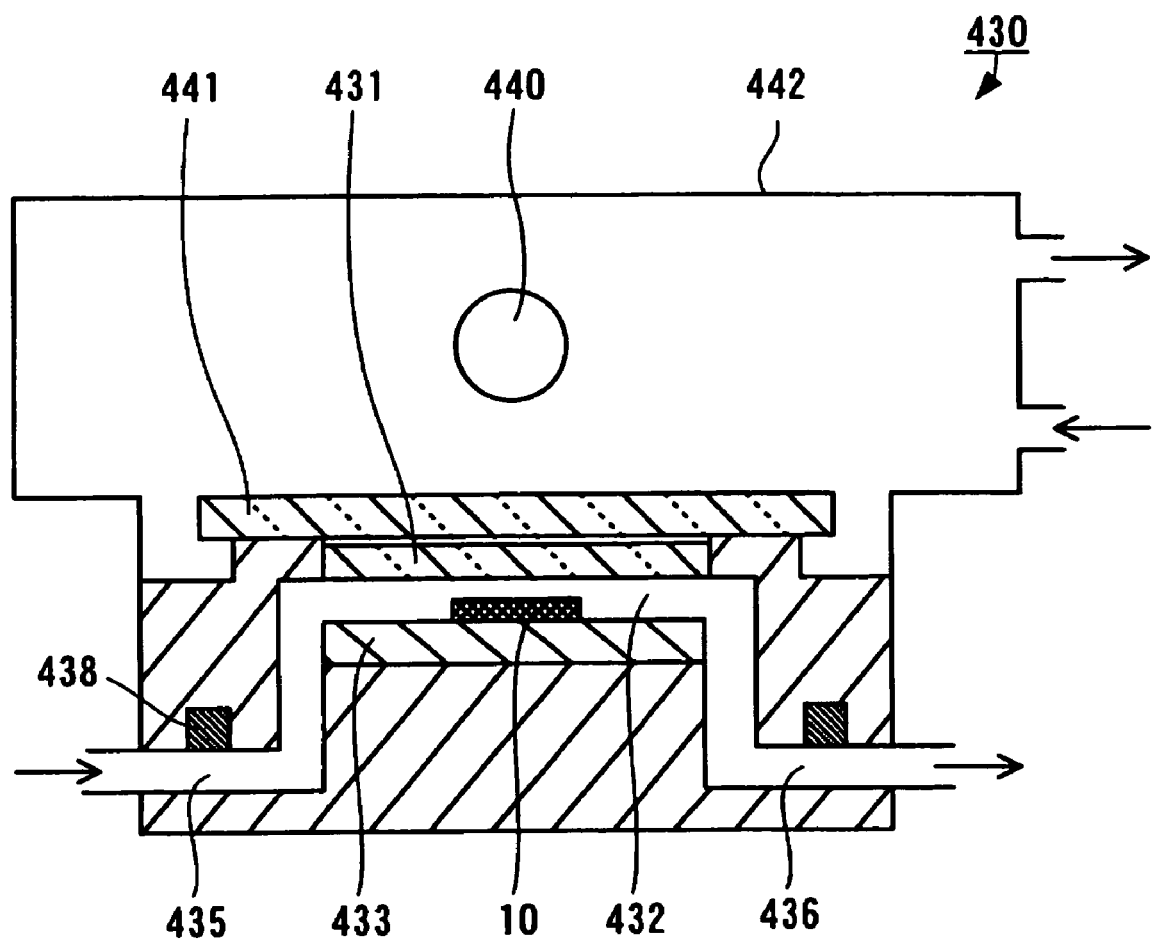
FIG. 8 is a schematic of a surface reformation apparatus.

FIG. 8 shows the surface reformation apparatus. A processing table 433, on which the member to-be-processed 10 is placed, is disposed at the central part of the surface reformation apparatus 430. A processing chamber 432 is defined over the processing table 433. The processing chamber 432 is tightly sealed by a sealing material 438. A processing-gas supply passage 435 and a processing-gas exhaust passage 436 are formed before and behind the processing chamber 432. A gas, which contains fluorine activated outside by a so-called "remote plasma", is supplied into the processing chamber 432 through the processing-gas supply passage. The processing-gas exhaust passage 436 is connected to an scrubber (not shown) so as to make exhaust gas nontoxic.

An ultraviolet lamp 440 is arranged over the processing chamber 432. Incidentally, when the ultraviolet lamp 440 is lit up in the atmospheric air, it burns out, so that it is arranged in an ultraviolet lamp chamber 442, in which the internal air can be replaced with nitrogen gas. The wall of the ultraviolet lamp chamber 442 on the side of the processing chamber 432 is made of a glass plate 441 which transmits ultraviolet radiation, whereby the member to-be-processed 10 can be irradiated with the ultraviolet radiation. On the other hand, the wall of the processing chamber 432 on the side of the ultraviolet lamp chamber 442 is made of fluorite 431 which transmits the ultraviolet radiation, whereby the member to-be-processed can be irradiated with the ultraviolet radiation, and the glass plate 441 is prevented from corroding due to the excited active species of fluorine supplied into the processing chamber 432.

Next, the each step of the film formation method according to the second exemplary embodiment is described in detail in the order of the steps. FIGS. 9(1)–10(3) show the film formation method according to the second exemplary embodiment. Portions constructed similarly to those of the first exemplary embodiment shall be omitted from description.

First, a resist film is formed on the front surface of a member to-be-processed. Subsequently, as shown in FIG. 9(2), a recess 18 to form a wiring pattern is provided in the resist film 16. Concrete methods for these steps are the same as in the first exemplary embodiment. Thus, a silicon wafer being the member to-be-processed 10 is denuded at the bottom of the recess 18.

Subsequently, the front surface of the patterned resist is fluorinated. First, the member to-be-processed 10 is arranged in the processing chamber 432 of the surface reformation apparatus 430 shown in FIG. 8. Secondly, a fluorine containing gas, such as $CF_4$ gas, activated by the remote plasma beforehand, is introduced from the processing-gas supply passage 435 into the processing chamber 432. Then, organic substances, such as the resist react with the excited active species of fluorine to be fluorinated, and a fluorine compound having a repellency is produced on the surface of the resist. Incidentally, the remote plasma is not restricted to a method of applying high-frequency power, but the gas containing fluorine can be activated even by a method of irradiating this gas with an electron beam or ultraviolet radiation. On the other hand, silicon oxide of which the silicon wafer is made, or the like is denuded at the wiring pattern forming part, so that the part is hardly fluorinated even when exposed to the gas containing the activated fluorine.

Simultaneously with the introduction of the gas, the whole surface of the member to-be-processed 10 is irradiated with ultraviolet radiation. Then, the reaction between the excited active species of the fluorine and the resist film is promoted, and the surface of the resist film is endowed with a high repellency. On the other hand, the fluorine compound is removed from the surface of the silicon oxide or the like at the pattern forming part, and a lyophilic property, which is intrinsic to the silicon oxide, is positively maintained.

By the way, in order to endow the pattern forming part with a further lyophilic property, adherence improvement processing by irradiation with ultraviolet radiation, or the like may well be performed together with a film-formation processing step to be stated below. Thus, the adherence between the member to-be-processed and a pattern material solution can be enhanced.

Incidentally, the surface reformation of the resist as stated above should preferably be done before the annealing processing of the resist. The reason is that, before the reaction of the resist is ended by the annealing processing, the fluorination can be easily performed by the reaction of the fluorine with the resist.

Subsequently, as shown in FIG. 10(1), the recess to form the wiring pattern is filled up with the pattern material solution 20 (film-formation processing step). Concretely, the member to-be-processed subjected to the above processing steps is arranged in the processing chamber of the film-formation processing apparatus 230 shown in FIG. 2. Subsequently, the pattern material solution and a reaction gas are supplied into the processing chamber (material supply step). On that occasion, the above pattern material solution is misted, and preferably the misted pattern material solution and the above reaction gas are mixed so as to be supplied into the processing chamber.

Subsequently, the pattern material solution and the reaction gas, which have been supplied into the processing chamber, are irradiated with electrons by an electron-beam irradiation pipe or the like (electron irradiation step). Then, the reaction gas falls into a plasma state. By way of example, in a case where the reaction gas is hydrogen gas, an irradiating electron beam non-elastically collides with electrons in hydrogen molecules, whereby the hydrogen molecules are activated by receiving energy, and excited active species, such as hydrogen atoms (H), hydrogen radicals (H*) and hydrogen ions (H+) are produced. The excited active species reduce copper oxide produced from the pattern material solution as stated above, and lower a wiring resistance (film-quality enhancement step).

Subsequently, the pattern material solution is deposited onto the surface of the member to-be-processed (deposition step). The droplets of the superfluous pattern material solution deposited on the resist film is removed (droplet removal step). Concrete methods for these steps are the same as in the first exemplary embodiment.

Subsequently, the member to-be-processed 10 is heated to dry the pattern material solution (drying step). By the way, in a case where the organic solvent is butyl acetate, the boiling point thereof is about 120 to 125° C., and hence, the pattern material solution is dried at 100° C. or less for 5 minutes or more. Subsequently, the shaping working of the pattern film is performed as may be needed (shaping step). Incidentally, since the wiring pattern has its electric characteristics computed by premising a rectangular section, the predicted characteristics can be realized by the shaping working of the wiring pattern into the rectangular section. Subsequently, as shown in FIG. 10(2), the resist film is removed (mask removal step). Concrete methods for these steps are the same as in the first embodiment. Subsequently, the annealing processing (baking) of the pattern films is performed (annealing processing step). By the way, in a case where the pattern material solution is the copper-acetate solution, the temperature of the annealing processing is set at about 300° C. Incidentally, it is also possible to introduce hydrogen radicals into an atmosphere of the annealing processing, thereby to reduce any copper oxide contained in the metal copper film.

Owing to the above, as shown in FIG. 10(3), the wiring pattern 14 is formed of the pattern film 20 of the metal copper on the surface of the member to-be-processed 10.

The film formation method according to the second exemplary embodiment described above is constructed having the step of supplying the gas containing fluorine onto the surface of the member to-be-processed, and also irradiating the member to-be-processed with the ultraviolet radiation, whereby the pattern forming part of the surface of the member to-be-processed is subjected to the lyophilic processing for the pattern material solution, while at the same time, the parts of the surface of the member to-be-processed except the pattern forming part are subjected to the processing for the repellency to the pattern material. Thus, the number of steps is permitted to decrease, and a manufacturing cost can be reduced or curtailed.

Incidentally, although the method of reforming the selected areas of the surface of the member to-be-processed whose surface has the resist and the silicon oxide has been described above, the selective surface reformation can be similarly performed for a member to-be-processed whose surface has any organic substance other than the resist, and any oxide other than the silicon oxide.

Next, a third exemplary embodiment will be described. As shown in FIG. 13(3), a film formation method according to the third embodiment forms a wiring pattern 14 and an insulating film 22 for electrically isolating the wiring pattern, on the front surface of a member to-be-processed 10, such as wafer substrate.

Incidentally, portions constructed similarly to those of the first and second embodiments shall be omitted from the description.

In the third exemplary embodiment, as in the second exemplary embodiment, there is exemplified the case of using the organic solvent solution of copper acetate as a pattern material solution for the wiring line and forming the wiring pattern made of metal copper. There is exemplified a case of forming a film of silicon dioxide ($SiO_2$) as the insulating film which electrically isolates the wiring pattern.

In the third exemplary embodiment, the insulating film is first formed on parts other than a wiring pattern forming part, and the wiring pattern of a metal copper film is formed by utilizing the insulating film as a mask. Therefore, the front surface of the insulating film should preferably be subjected to repellency processing. In this regard, it is also possible that, as in the first exemplary embodiment, a fluorocarbon-resin polymerization film having a repellency is formed on the whole surface of the member to-be-processed, whereupon the fluorocarbon-resin polymerization film of the wiring pattern forming part is removed by irradiating it with ultraviolet radiation. In the third embodiment, however, a direct lithography apparatus as stated below is used for forming the fluorocarbon-resin polymerization film at only the necessary parts.

Figure 11:
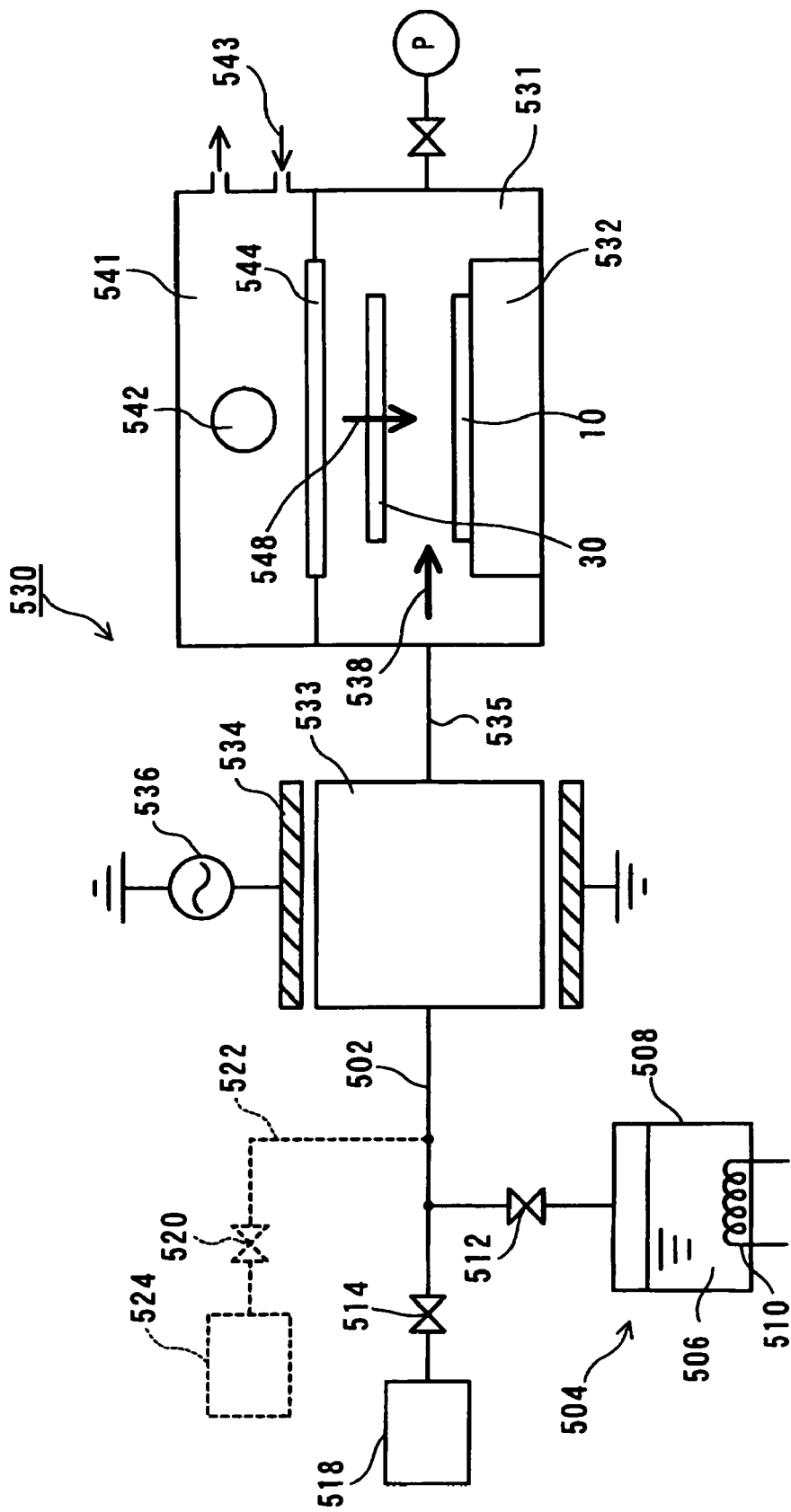
FIG. 11 is a schematic of a direct lithography apparatus.

A view for explaining the direct lithography apparatus is shown in FIG. 11. The direct lithography apparatus 530 has a processing chamber 531, in which a stage 532 capable of placing the member to-be-processed 10 thereon is formed. Besides, it is permitted to arrange a mask 30 over the stage. On the other hand, an ultraviolet lamp 542 is arranged over the chamber 531. Incidentally, when the ultraviolet lamp 542 is lit up in the atmospheric air, it burns out, so that it is arranged in an ultraviolet lamp chamber 541, in which the internal air can be replaced with nitrogen gas 543. The boundary surface between the ultraviolet lamp chamber 541 and the processing chamber 531 is made of fluorite 544 which transmits ultraviolet radiation, whereby the member to-be-processed can be irradiated with the ultraviolet radiation, and it is prevented from corroding due to the excited active species of fluorine supplied into the processing chamber 531.

A plasma chamber 533 is connected to the processing chamber 531 through a supply pipe 535. The plasma chamber is formed between opposing electrodes 534, and a high-frequency power source 536 is connected to one of the opposing electrodes 534. Further, a processing-gas supply portion 504 is connected to the plasma chamber 533 through a supply pipe 502 furnished with a flow control valve 512. The processing-gas supply portion 504 has a vessel 508 in which a liquid organic substance 506 made up of a straight-chain PFC such as Fluorinert is reserved. The vessel 508 is provided with a heater 510 serving as a heating part, whereby the liquid organic substance 506 can be heated to vaporize. Besides, a carrier-gas supply portion 518 is connected to downstream of the flow control valve 512 of the supply pipe 502 through a carrier pipe 516 furnished with a flow control valve 514. An inert gas, such as nitrogen or argon, is used as a carrier gas. Further, as indicated by broken lines in FIG. 11, a second-processing-gas supply portion 524 is connected to the supply pipe 502 through a pipe 522 having a flow control valve 520. Herein, $CF_4$ is added as a second processing gas from the second-processing-gas supply portion 524 into the vapor of the liquid organic substance 506.

Next, the each step of the film formation method according to the third exemplary embodiment is described in detail in the order of the steps. FIGS. 12(1)–13(3) show the film formation method according to the third exemplary embodiment. Portions constructed similarly to those of the first and second exemplary embodiments are omitted from description.

First, a resist film 17 is formed on the wiring pattern forming part of the front surface 12 of a member to-be-processed 10 (resist coating step). As a resist, it is also possible to use a material, which has repellency in itself, such as a resist in which a fluorocarbon resin is blended. As a concrete procedure of formation, the resist film 17 is first formed on the whole surface of the member to-be-processed 10. Subsequently, as shown in FIG. 12(2), a protrusion 19 for a wiring pattern is formed in the resist film 17. Concretely, a photo-mask (not shown) in which the wiring pattern is lithographed, is arranged over the resist film 17, and the resist film 17 is exposed to light and subjected to developing, whereby the resist film 17 is left at the wiring pattern forming part, and is removed at the other parts.

Subsequently, as shown in FIG. 12(3), an insulating film 22 is formed on the parts, where the resist film has been removed by the above process, by employing the remaining resist film 17 as a mask (insulating-film formation step). A silicon dioxide ($SiO_2$) film, for example, is formed as the insulating film 22. In this case, the resulting member to-be-processed 10 is coated with an inorganic SOG solution such as silicate or alkoxysilicate. Herein, since the resist made of the repellent material is used, the SOG solution does not precipitate on the resist film 17, and it precipitates on only the parts, where the resist film has been removed. Incidentally, a film quality can be enhanced concurrently with the formation of the silicon dioxide film. That is, the concentration of oxygen contained in the silicon dioxide film is changed by adding ozone gas, whereby the dielectric constant of the film can be adjusted. Incidentally, it is also possible to form the silicon dioxide film by CVD or the like. Subsequently, the resulting member to-be-processed is heated at 200° C. or more to bake the silicon dioxide film. Incidentally, the concentration of oxygen contained in the silicon dioxide film can also be adjusted by introducing the ozone gas into an atmosphere during the baking.

Subsequently, as shown in FIG. 13(1), the resist film 17 is removed (resist removal step). A concrete method for the removal is the same as in the first embodiment. Then, a recess 18 is formed in the wiring pattern forming part.

Subsequently, as shown in FIG. 13(2), a fluorocarbon-resin polymerization film is formed on the front surface of the insulating film 22. Concretely, in the direct lithography apparatus 530 shown in FIG. 11, the member to-be-processed 10 is first set on the stage 532 of the repellency processing device 530, and the mask 30 is arranged over the member to-be-processed. Subsequently, the ultraviolet lamp 542 is lit up to irradiate the member to-be-processed 10 with ultraviolet radiation 548. Since the mask 30 has a light transmitting property at only its part corresponding to the wiring pattern forming part, only the wiring pattern forming part is irradiated with the ultraviolet radiation 548 through the mask 30.

At the same time, an activated raw-material gas 538 is supplied into the chamber so as to form a fluorocarbon-resin polymerization film on the surface of the member to-be-processed 10. Concretely, the liquid organic substance 506 made up of the straight-chain PFC or the like is first heated to vaporize, and the vapor of the straight-chain PFC is supplied into the supply pipe 502. Subsequently, the carrier gas is supplied from the carrier-gas supply portion 518 so as to introduce the vapor of the straight-chain PFC into the plasma chamber 533. Incidentally, if necessary, the $CF_4$ gas is supplied from the second-processing-gas supply portion 524 and is added into the vapor of the straight-chain PFC.

When high-frequency power is applied to the vapor of the straight-chain PFC in the plasma chamber 533, the straight-chain PFC has some of its bonds severed and is activated. The activated straight-chain PFC is supplied into the processing chamber 531. Incidentally, apart from the application of the high-frequency power, the straight-chain PFC can be activated by irradiation with an electron beam or by irradiation with ultraviolet radiation.

Owing to the above, the active straight-chain PFC having reached the surface of the insulating film 22 is polymerized, so that the fluorocarbon-resin polymerization film is formed. Incidentally, the thickness of the polymerization film is made 100 angstroms or less. In contrast, at the wiring pattern forming part, the polymerizing reaction is blocked by the ultraviolet radiation, and the bonds of the formed polymerization film are severed, so that the formation of the fluorocarbon-resin polymerization film is blocked. Moreover, the resist and the like organic substances having adhered to the pertinent part are removed, so that a lyophilic property is afforded to the pertinent part.

Further, the fluorocarbon-resin polymerization film may well be subjected to annealing processing. Thus, the mechanical strength of the polymerization film can be enhanced. Low-molecular organic substances contained in the polymerization film are vaporized and removed, whereby the low-molecular organic substances can be prevented from mixing into the pattern film. The annealing processing may well be performed concurrently with the formation of the polymerization film.

Subsequently, the recess to form the wiring pattern is filled up with the pattern material solution (film-formation processing step). That is, the wiring pattern is formed by utilizing the insulating film formed above, as a mask. A concrete method for the formation is the same as in the first exemplary embodiment.

Subsequently, the pattern material solution is dried (drying step). Subsequently, the annealing processing of the pattern film is performed (annealing processing step). Concrete methods for these steps are the same as in the first embodiment. However, carbonization as in the case of the resist film need not be considered for the insulating film used for the mask in the third exemplary embodiment, so that even when the temperature of the annealing processing exceeds 200° C., the drying step and the annealing processing step can be continuously carried out.

Owing to the above, as shown in FIG. 13(3), the wiring pattern 14 is formed of the metal copper film being the pattern film 20, on the surface of the member to-be-processed 10.

The film formation method according to the third exemplary embodiment described above is constructed having 1) the step of providing the insulating film on the surface of the member to-be-processed, 2) the step of defining the wiring pattern forming recess by the insulating film, 3) the step of subjecting the surface of the insulating film to the processing for the repellency to the pattern material solution, and 4) the step of filling up the recess with the pattern material solution. The film formation is performed by utilizing the insulating film or the like structure as the mask, whereby a manufacturing process is simplified, and a manufacturing cost can be curtailed. Moreover, since the carbonization need not be considered for the insulating film, the drying step and the baking step can be continuously carried out. Accordingly, the manufacturing process is simplified, and the manufacturing cost can be curtailed.

The exemplary embodiment is so constructed that the recess to form the wiring pattern is provided by 1) the step of providing the resist film on the surface of the member to-be-processed, 2) the step of defining the protrusion for the wiring pattern by the resist film, 3) the step of providing the insulating film on the parts other than the protrusion, and 4) the step of removing the protrusion. Thus, the step of etching back the insulating film can be omitted, so that the manufacturing process is simplified, and the manufacturing cost can be curtailed.

The exemplary embodiment is so constructed that the resist material itself has the repellency to the solution of the material of the insulating film. Thus, the step of repellency processing for the surface of the resist film can be omitted. Accordingly, the manufacturing process is simplified, and the manufacturing cost can be curtailed.

The film formation method according to the third exemplary embodiment is so constructed as to perform the direct lithography step by blocking the formation of the fluorocarbon-resin polymerization film on the pattern forming part in such a way that the PFC gas is supplied onto the surface of the member to-be-processed, while at the same time, the pattern forming part of the surface of the member to-be-processed is irradiated with the ultraviolet radiation. Thus, it is possible to decrease the number of steps, and the manufacturing cost can be curtailed.

Incidentally, the method of direct lithography, in which the pattern forming part is irradiated with the light simultaneously with the formation of the polymerization film, is described above. Alternatively, however, the direct lithography is also permitted in such a way that a hard mask having openings in the parts other than the pattern forming part is placed on the surface of the member to-be-processed, whereupon the polymerization film is formed at the openings.

In this regard, it is also allowed to employ a construction in which the material of the insulating film has repellency to the pattern material solution. in this case, since the step of direct lithography for the surface of the insulating film can be omitted, the manufacturing process is simplified, and the manufacturing cost can be curtailed.

Figure 16:
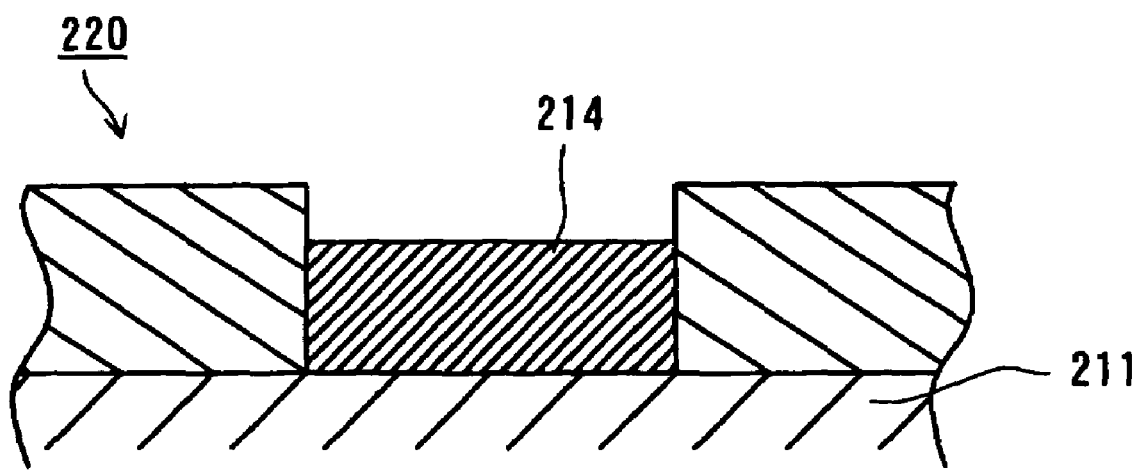
FIG. 16 is a first schematic of a microscopic structure.
Figure 17:
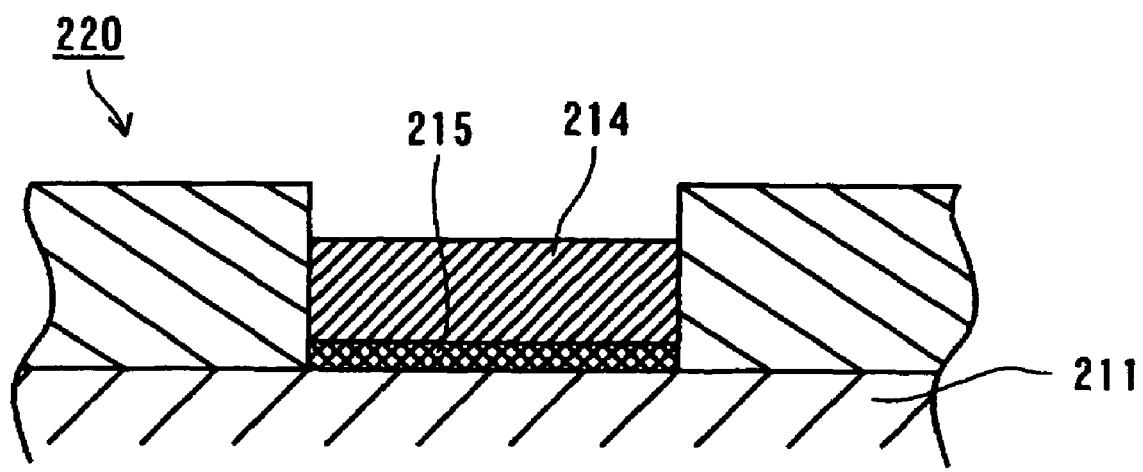
FIG. 17 is a second schematic of a microscopic structure.

A structure in which a functional thin film is formed on a substrate by the film formation method of the present invention is applied to, for example, a semiconductor device, an electric circuit, a display unit module, and a light emitting element. Examples of the structure are shown in FIGS. 16 and 17. FIG. 16 is a schematic view of, for example, the semiconductor device, the electric circuit or the display unit module, while FIG. 17 is a schematic view of a microscopic structure, in which the light emitting element, for example, is formed. Referring to FIG. 16, the functional thin film 214 of the semiconductor device and the electric circuit is mainly the metal thin film of, for example, a wiring pattern, and the functional thin film 214 of the display unit module is the organic molecule film of, for example, a color filter. The film formation method of the present invention can be applied to the film formation processes of these devices. Although an example of the color filter is shown in FIG. 16, another functional thin film is similarly formed by employing the pattern formation method of the present invention. Referring to FIG. 17, the functional thin film 214 of the light emitting element is a thin film of organic EL (electro luminescence) which is used for, for example, a light emitting layer. An electrode (not shown) which pairs with a transparent electrode 215 shown in the figure is formed on a transparent substrate 211, and the element is formed in a shape in which the functional thin film 214 is sandwiched in between the electrodes. It is needless to say that the electrodes can also be formed by employing the pattern formation method of the present invention. Incidentally, the thickness of the functional thin film 214 should preferably be set at 0.02 to 4 μm though it is optional, depending upon the intended use of the microscopic structure. The semiconductor device, etc. in which the film formation method of the present invention is applied to the functional thin films are high in quality, and the method of the present invention is superior to the conventional method in points of simplifying the manufacturing processes of the semiconductor device, etc. and curtailing the manufacturing costs thereof.

The invention claimed is:

1. A method of forming a film of predetermined pattern on a front surface of a member to-be-processed, comprising:
    forming a resist film on the entire surface of the member to be processed;
    processing a surface of a mask for repellency to a pattern material solution, the processing including forming a film on the entire surface of the member-to-be processed;
    washing the member to-be-processed; and
    subsequently filling up a pattern forming recess provided in the mask at the surface of the member to-be-processed with the pattern material solution.

2. The film formation method of claim 1, further comprising:
    lyophilic processing a bottom of a pattern forming recess for a pattern material solution.

3. A film formation method, comprising:
    performing the method of claim 1; and
    subsequently shaping a surface of the pattern film.

4. A film formation method, comprising:
    performing the method of claim 1; and
    subsequently reforming the pattern film.

5. The film formation method of claim 1, the filling up the recess with the pattern material solution being performed by spraying misted pattern material solution onto the surface of the member to-be-processed.

6. The film formation method of claim 5, the filling up the recess with the pattern material solution being performed by attracting the misted pattern material solution by applying a bias voltage to the member to-be-processed.

7. The film formation method of claim 6, the filling up the recess with the pattern material solution being performed by charging the pattern material solution by irradiating the misted pattern material solution with an electron beam.

8. The film formation method as defined in claim 1, wherein the filling up the recess with the pattern material solution is performed by rotating the member to-be-processed.

9. The film formation method of claim 1, further comprising:

performing the washing and subsequent filling up in an identical apparatus.

10. A device manufactured using the film formation method of claim 1.

11. A method of manufacturing a device, comprising:
forming a thin film on a member to-be-processed, the forming including filling up a pattern forming recess formed by a mask at a front surface of the member to-be-processed with a pattern material solution by employing the film formation method of claim 1.

12. The film forming method of claim 1, the film that is formed on the entire surface of the member-to-be processed being a fluorocarbon-resin polymerization film.

13. A method of forming a film of predetermined pattern on a front surface of a member to-be-processed, comprising:
forming a resist film on the entire surface of the member to be processed;
processing a surface of a mask for repellency to a pattern material solution, the processing including forming a film on the entire surface of the member-to-be processed;
filling up a pattern forming recess provided in the mask at the surface of the member to-be-processed with the pattern material solution; and
drying the pattern material solution.

14. A film formation method, comprising:
preheating a member to-be-processed; and
subsequently performing the method of claim 13.

15. A film formation method, comprising:
washing a member to-be-processed; and
subsequently performing the method of claim 13.

16. A method of forming a film of predetermined pattern on a front surface of a member to-be-processed, comprising:
forming a resist film on the entire surface of the member to be processed;
processing a surface of a mask for repellency to a pattern material solution, the processing including forming a film on the entire surface of the member-to-be processed;
filling up a pattern forming recess provided in the mask at the surface of the member to-be-processed with the pattern material solution; and
subjecting the pattern film to annealing processing.

17. The film formation method of claim 16, the annealing processing being performed in an active gas atmosphere that maintains a film quality of the pattern film.

18. The film formation method of claim 16, the annealing processing being performed in an active gas atmosphere that enhances a film quality of the pattern film.

19. A method of forming a film of predetermined pattern on a front surface of a member to-be-processed, comprising:
forming a resist film on the entire surface of the member to be processed;
processing a surface of a mask for repellency to a pattern material solution, the processing including forming a film on the entire surface of the member-to-be processed;
filling up a pattern forming recess provided in the mask at the surface of the member to-be-processed with the pattern material solution; and
enhancing a film quality of the pattern film by processing the pattern material solution.

20. A method of forming a film of predetermined pattern on a front surface of a member to-be-processed, comprising:
forming a resist film on the entire surface of the member to be processed;
processing a surface of a mask for repellency to a pattern material solution, the processing including forming a film on the entire surface of the member-to-be processed;
enhancing adherence of the pattern material solution to the member to-be-processed; and
filling up a pattern forming recess provided in the mask at the surface of the member to-be-processed with the pattern material solution.

21. A method of forming a film of predetermined pattern on a front surface of a member to-be-processed, comprising:
forming a resist film on the entire surface of the member to be processed;
processing a surface of a mask for repellency to a pattern material solution, the processing including forming a film on the entire surface of the member-to-be processed;
filling up a pattern forming recess provided in the mask at the surface of the member to-be-processed with the pattern material solution; and
removing the pattern material solution having adhered on the mask.

22. A method of forming a film of predetermined pattern on a front surface of a member to-be-processed, comprising:
forming a resist film on the entire surface of the member to be processed;
processing a surface of a mask for repellency to a pattern material solution, the processing including forming a film on the entire surface of the member-to-be processed;
filling up a pattern forming recess provided in the mask at the surface of the member to-be-processed with the pattern material solution;
drying the pattern material solution; and
subjecting the pattern film to annealing processing.

23. A method of forming a film of predetermined pattern on a front surface of a member to-be-processed, comprising:
forming a resist film on the entire surface of the member to be processed;
processing a surface of a mask for repellency to a pattern material solution, the processing including forming a film on the entire surface of the member-to-be processed;
filling up a pattern forming recess provided in the mask at the surface of the member to-be-processed with the pattern material solution;
enhancing a film quality of the pattern film by processing the pattern material solution; and
drying the pattern material solution.

24. A method of forming a film of predetermined pattern on a front surface of a member to-be-processed, comprising:
forming a resist film on the entire surface of the member to be processed;
processing a surface of a mask for repellency to a pattern material solution, the processing including forming a film on the entire surface of the member-to-be processed;
enhancing an adherence of the pattern material solution to the member to-be-processed;
filling up a pattern forming recess provided in the mask at the surface of the member to-be-processed with the pattern material solution; and
drying the pattern material solution.

25. A method of forming a film of predetermined pattern on a front surface of a member to-be-processed, comprising:
forming a resist film on the entire surface of the member to be processed;

processing a surface of a mask for repellency to a pattern material solution, the processing including forming a film on the entire surface of the member-to-be processed;

filling up a pattern forming recess provided in the mask at the surface of the member to-be-processed with the pattern material solution;

removing the pattern material solution having adhered on the mask; and drying the pattern material solution.

26. A method of forming a film of predetermined pattern on a front surface of a member to-be-processed, comprising:

forming a resist film on the entire surface of the member to be processed;

processing a surface of a mask for repellency to a pattern material solution, the processing including forming a film on the entire surface of the member-to-be processed;

filling up a pattern forming recess provided in the mask at the surface of the member to-be-processed with the pattern material solution;

enhancing a film quality of the pattern film by processing the pattern material solution; and subjecting the pattern film to annealing processing.

27. A method of forming a film of predetermined pattern on a front surface of a member to-be-processed, comprising:

forming a resist film on the entire surface of the member to be processed;

processing a surface of a mask for repellency to a pattern material solution, the processing including forming a film on the entire surface of the member-to-be processed;

enhancing an adherence of the pattern material solution to the member to-be-processed;

filling up a pattern forming recess provided in the mask at the surface of the member to-be-processed with the pattern material solution; and subjecting the pattern film to annealing processing.

28. A method of forming a film of predetermined pattern on a front surface of a member to-be-processed, comprising:

forming a resist film on the entire surface of the member to be processed;

processing a surface of a mask for repellency to a pattern material solution, the processing including forming the film on the entire surface of the member-to-be processed;

filling up a pattern forming recess provided in the mask at the surface of the member to-be-processed with the pattern material solution;

removing the pattern material solution having adhered on the mask; and subjecting the pattern film to annealing processing.

29. A method of forming a film of predetermined pattern on a front surface of a member to-be-processed, comprising:

forming a resist film on the entire surface of the member to be processed;

processing a surface of a mask for repellency to a pattern material solution, the processing including forming a film on the entire surface of the member-to-be processed;

enhancing an adherence of the pattern material solution to the member to-be-processed;

filling up a pattern forming recess provided in the mask at the surface of the member to-be-processed with the pattern material solution; and enhancing a film quality of the pattern film by processing the pattern material solution.

30. A method of forming a film of predetermined pattern on a front surface of a member to-be-processed, comprising:

forming a resist film on the entire surface of the member to be processed;

processing a surface of a mask for repellency to a pattern material solution, the processing including forming a film on the entire surface of the member-to-be processed;

filling up a pattern forming recess provided in the mask at the surface of the member to-be-processed with the pattern material solution;

enhancing a film quality of the pattern film by processing the pattern material solution; and removing the pattern material solution having adhered on the mask.

31. A method of forming a film of predetermined pattern on a front surface of a member to-be-processed, comprising:

forming a resist film on the entire surface of the member to be processed;

processing a surface of a mask for repellency to a pattern material solution, the processing including forming a film on the entire surface of the member-to-be processed;

enhancing an adherence of the pattern material solution to the member to-be-processed;

filling up a pattern forming recess provided in the mask at the surface of the member to-be-processed with the pattern material solution; and removing the pattern material solution having adhered on the mask.

32. A method of forming a film of predetermined pattern on a front surface of a member to-be-processed, comprising:

forming a resist film on the entire surface of the member to be processed;

processing a surface of a mask for repellency to a pattern material solution, the processing including forming a film on the entire surface of the member-to-be processed;

enhancing an adherence of the pattern material solution to the member to-be-processed;

filling up a pattern forming recess provided in the mask at the surface of the member to-be-processed with the pattern material solution;

enhancing a film quality of the pattern film by processing the pattern material solution;

removing the pattern material solution having adhered on the mask;

drying the pattern material solution; and subjecting the pattern film to an annealing processing.

* * * * *